(12) United States Patent
Nishikimi et al.

(10) Patent No.: US 8,902,623 B2
(45) Date of Patent: Dec. 2, 2014

(54) POWER INVERTER

(71) Applicant: Hitachi, Ltd., Tokyo (JP)

(72) Inventors: Fusanori Nishikimi, Hitachinaka (JP); Kinya Nakatsu, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/018,613

(22) Filed: Sep. 5, 2013

(65) Prior Publication Data

US 2014/0016387 A1  Jan. 16, 2014

Related U.S. Application Data

(63) Continuation of application No. 13/419,884, filed on Mar. 14, 2012, now Pat. No. 8,587,977, which is a continuation of application No. 13/253,130, filed on Oct. 5, 2011, now Pat. No. 8,462,531, which is a continuation of application No. 12/188,630, filed on Aug. 8, 2008.

(30) Foreign Application Priority Data

Aug. 9, 2007  (JP) ................................. 2007-208505

(51) Int. Cl.
*H02M 1/00* (2006.01)
*H05K 7/20* (2006.01)
*H02M 7/00* (2006.01)

(52) U.S. Cl.
CPC ........... *H02M 7/003* (2013.01); *H05K 7/20927* (2013.01)
USPC ............................ 363/144; 361/709; 361/719

(58) Field of Classification Search
USPC ........ 363/40, 55, 56.01, 71, 72, 98, 109, 131, 363/141; 361/760, 761, 763, 767, 775, 796, 361/679.46, 679.47, 703, 831
See application file for complete search history.

(56) References Cited

U.S. PATENT DOCUMENTS

| 4,458,305 | A | * | 7/1984 | Buckle et al. ................ 363/141 |
| 6,717,054 | B2 | | 4/2004 | Rolston et al. |
| 6,943,445 | B2 | | 9/2005 | Shirakawa et al. |
| 7,092,238 | B2 | | 8/2006 | Saito et al. |

(Continued)

FOREIGN PATENT DOCUMENTS

| EP | 2 006 989 A2 | 12/2008 |
| JP | 9-275187 A | 10/1997 |

(Continued)

OTHER PUBLICATIONS

Chinese Office Action mailed Dec. 21, 2010 including English-language translation (Six (6) pages).

(Continued)

*Primary Examiner* — Nguyen Tran
(74) *Attorney, Agent, or Firm* — Crowell & Moring LLP

(57) ABSTRACT

In a power inverter, a coolant passage is fixed to a chassis to cool the chassis; the chassis is divided into a first region and a second region by providing the coolant passage in the chassis; a power module is provided in the first region as fixed to the coolant passage; a capacitor module is provided in the second region; and the DC terminal of the capacitor module is directly connected to the DC terminal of the power module.

5 Claims, 26 Drawing Sheets

(56) References Cited

U.S. PATENT DOCUMENTS

| | | |
|---|---|---|
| 7,187,568 B2 | 3/2007 | Radosevich et al. |
| 7,710,721 B2 | 5/2010 | Matsuo et al. |
| 7,974,101 B2 | 7/2011 | Azuma et al. |
| 2002/0118560 A1 | 8/2002 | Ahmed et al. |
| 2004/0062006 A1 | 4/2004 | Pfeifer et al. |
| 2005/0253165 A1 | 11/2005 | Pace et al. |
| 2006/0092611 A1 | 5/2006 | Beihoff et al. |
| 2007/0002594 A1 | 1/2007 | Otsuka et al. |
| 2007/0109715 A1 | 5/2007 | Azuma et al. |
| 2007/0165376 A1 | 7/2007 | Bones et al. |
| 2008/0049477 A1 | 2/2008 | Fujino et al. |
| 2008/0123375 A1 | 5/2008 | Beardsley |
| 2010/0188813 A1 | 7/2010 | Nakatsu et al. |

FOREIGN PATENT DOCUMENTS

| | | |
|---|---|---|
| JP | 2001-308246 A | 11/2001 |
| JP | 2002-034268 A | 1/2002 |
| JP | 2002-373971 A | 12/2002 |
| JP | 2004-265931 A | 9/2004 |
| JP | 2005-192296 A | 7/2005 |
| JP | 2005-198460 A | 7/2005 |
| JP | 2005-347561 A | 12/2005 |
| JP | 2007-49810 A | 2/2007 |
| JP | 2007-143272 A | 6/2007 |
| JP | 2007-195292 A | 8/2007 |

OTHER PUBLICATIONS

U.S. Office Action mailed Jun. 28, 2012, in U.S. Appl. No. 13/253,130.

U.S. Office Action mailed Nov. 28, 2012 in U.S. Appl. No. 13/253,130.

U.S. Office Action mailed Aug. 2, 2013 in U.S. Appl. No. 12/188,630.

Japanese Office Action dated May 7, 2014 with English translation (nine pages).

\* cited by examiner

COOLANT FLOW IN
COOLANT FLOW OUT

WAVEFORM AT TURN ON

POWER INVERTER

CROSS-REFERENCE TO RELATED APPLICATIONS

This application is a continuation application of Ser. No. 13/419,884, filed Mar. 14, 2012, which is a continuation application of Ser. No. 13/253,130, filed Oct. 5, 2011, which is a continuation application of Ser. No. 12/188,630, filed Aug. 8, 2008, which claims priority under 35 U.S.C. §119 to Japanese Patent Application No. JP 2007-208505, filed Aug. 9, 2007, the entire disclosures of which are herein expressly incorporated by reference.

BACKGROUND OF THE INVENTION

1. Field of the Invention

The present invention relates to a power inverter that converts Direct Current (DC) power into Alternate Current (AC) power and vice versa.

2. Description of Related Art

The power inverter includes a function with which DC power supplied from a DC power supply is converted into AC power to be supplied to an AC electricity load such as an electric rotating machine, and a function with which AC power generated by an electric rotating machine is converted into DC power to be supplied to a DC power supply. To perform the conversion function, the power inverter further includes an inverter circuit which includes a switching device, and by repeating conduction operation and interrupt operation with the switching device, the power inverter converts from DC power to AC power or AC power to DC power.

Spike voltage is generated by inductance that exists in the circuit because the switching operation cuts off the current. For reducing the spike voltage, it is preferable to provide a smoothing capacitor and to reduce inductance at a DC circuit. A technology for controlling spike voltage by reducing inductance is disclosed in Japanese Laid Open Patent Publication No. 2002-34268 (patent document 1). According to the patent document 1, inductance is reduced by shortening wiring between the smoothing capacitor and the switching device so as to reduce the spike voltage.

An in-car power inverter is provided with DC power from an in-car battery and converts the DC power into three-phase AC power to be supplied to an electric rotating machine for vehicle, etc. As demand for torque generated by an electric rotating machine for vehicle is larger than that of early days, the power converted by a power inverter tends to be larger. The in-car power inverter is used under high-temperature environment in comparison to a power inverter for general industrial machinery installed in factories. It is hence desirable for the in-car power inverter to reduce heat generated by the power inverter itself in comparison to the general power inverter. Most of the heat generated by the power inverter itself is the heat generated by the switching device that constitutes the inverter circuit. It is thus desirable to reduce the heat generated by the switching device as much as possible.

Heating value by the switching device increases at switching from the interrupting state to the conducting state and at switching from the conducting state to the interrupting state. Therefore, it is desirable to reduce the heat at the switching operation. The first countermeasure for reducing the heating value is to shorten switching operation time of the switching device. The second countermeasure is to lengthen intervals between the switching operations for the switching device, in other words, to reduce the number of switching device operations per unit time. However, to extremely lengthen intervals between the switching operations for the switching device may reduce the accuracy of control. To greatly reduce the number of switching device operations per unit time has limit.

Japanese Laid Open Patent Publication No. 2007-143272 (patent document 2) discloses a technology for shortening switching operation time of a switching device of an inverter circuit to reduce heating value per switching operation of the switching device by lowering inductance.

As described above, the technology disclosed in the patent document 1 does not concern about reducing the heat at the switching operation of the switching device.

The patent document 2 discloses the technology for realizing low inductance that results in reducing the heat value per switching operation of switching device. The patent document 2, however, has a challenge in reducing the heat value and reducing the size of the power inverter because the power inverter, particularly the in-car power inverter, does not have enough space around it.

As electric energy converted by the power inverter increases, equipments tend to get bigger. So, it is preferable to minimize the volume of the equipments regardless of increase in the electric energy, in other words, for example, to increase the value of maximum convertible electric power per unit volume of the power inverter. For that, it is desirable to achieve a balance between low inductance and reduction in the size. Here, reduction in the size refers to maximization of the value of maximum convertible electric power per unit volume of the power inverter.

SUMMARY OF THE INVENTION

A power inverter according to a 1st aspect of the present invention includes: a power module that comprises a plurality of switching devices for an upper arm and a lower arm that make up an inverter circuit, a metal board that releases heat generated by the plurality of the switching devices, a DC terminal and an AC terminal; a smoothing capacitor module that comprise a DC terminal; a gate drive circuit that drives the power module; a coolant passage through which coolant flows; and a chassis that houses the power module, the capacitor module, the gate drive circuit, and the coolant passage, wherein: the coolant passage is fixed to the chassis to cool the chassis; the chassis is divided into a first region and a second region by providing the coolant passage in the chassis; the power module is provided in the first region as fixed to the coolant passage; the capacitor module is provided in the second region; and the DC terminal of the capacitor module is directly connected to the DC terminal of the power module.

According to a 2nd aspect of the present invention, in the power inverter according to the 1st aspect, it is preferable that the chassis is formed with an upper opening opened at an upper end and a lower opening at a lower end of the chassis; the first region exists between the coolant passage and the upper opening; the second region exists between the coolant passage and the lower opening; the lower opening is covered with a lower cover and the upper opening is covered with an upper cover; and a heat conduction passage is formed between the lower cover and the capacitor module.

A power inverter according to a 3rd aspect of the present invention includes: a chassis that comprises an upper opening at an upper end and a lower opening at a lower end of the chassis; an upper cover and a lower cover that cover the upper opening and the lower opening respectively; a power module that is housed in the chassis and comprises a plurality of switching devices for an upper arm and a lower arm that make up an inverter circuit, a metal board that releases heat generated by the plurality of the switching devices, and a DC terminal and an AC terminal; a smoothing capacitor module that comprises a DC terminal and smoothes a DC voltage applied to the DC terminal of the smoothing capacitor module, with the DC terminal of the smoothing capacitor module electrically connected with the DC terminal of the power module; a gate drive circuit, housed in the chassis, that drives the power module; and a coolant passage, on which the power module is mounted, that is provided substantially parallel to the upper cover or the lower cover in the chassis; wherein: the chassis is provided with a first region between the upper cover and the coolant passage and a second region between the lower cover and the coolant passage, by providing the coolant passage inside the chassis; the power module is provided in the first region; a semiconductor module for auxiliaries and the capacitor module are provided in the second region; and a space that links the first region and the second region is created between a side of the coolant passage and the chassis, and the DC terminal of the capacitor module and the DC terminal of the power module are electrically connected with each other through the space.

According to a 4th aspect of the present invention, in the power inverter according to the 3rd aspect, it is preferable that the chassis is a substantially rectangular on an upper side; a water passage is formed in the coolant passage from a short side of the chassis, extends along a long side of the chassis, turns around, and returns along another long side of the chassis again to the short side; the space that links the first region and the second region is formed between the water passage that extends along one of the long sides and the one of the long sides of the chassis; the power module is fixed on the water passage that is bent and extends along the long sides of the rectangle; and the DC terminal of the power module is placed in the space and electrically connected with the DC terminal of the capacitor module through the space.

According to a 5th aspect of the present invention, in the power inverter according to the 4th aspect, it is preferable that the DC terminal of the capacitor module and the DC terminal of the power module are electrically and directly connected with each other through the space.

According to a 6th aspect of the present invention, in the power inverter according to the 1st to 5th aspects, it is preferable that the chassis is formed with a heat conduction member, and the capacitor module and the gate drive circuit are cooled by coolant flowing through the coolant passage via the chassis.

According to a 6th aspect of the present invention, in the power inverter according to the 1st to 5th aspects, it is preferable that the chassis is formed with a heat conduction member, and the capacitor module and the gate drive circuit are cooled by coolant flowing through the coolant passage via the chassis.

According to a 7th aspect of the present invention, in the power inverter according to the 1st to 6th aspects, it is preferable that the DC terminal of the capacitor module, that is electrically connected with the DC terminal of the power module, comprises a positive busbar and a negative busbar, with the positive busbar and the negative busbar laminated to form a laminated busbar; each of the positive busbar and the negative busbar that make up the laminated busbar, comprises a connection section; the connection section of the positive busbar and the connection section of the negative busbar are bent in opposite directions to each other such that internal surfaces of the positive busbar and the negative busbar having been laminated are opened to provide connecting surfaces at the connection sections; and the DC terminal of the capacitor module is electrically connected to the DC terminal of the power module via the connecting surface of the positive busbar and the connecting surface of the negative busbar.

According to a 8th aspect of the present invention, in the power inverter according to the 1st to 7th aspects, it is preferable that the capacitor module includes: a capacitor case; a laminated busbar that comprises a positive busbar and a negative busbar sandwiching an insulation material to form a laminated structure, and a planar section that is an external surface of the laminated positive busbar and negative busbar; a plurality of capacitor cells that are arranged in parallel on the planar section of the laminated busbar and a positive terminal and a negative terminal of the capacitor cells are connected to the positive busbar and the negative busbar respectively; and the planar section of the laminated busbar and the plurality of the capacitor cells housed in the capacitor case; wherein: the laminated busbar extends and protrudes from the capacitor case, an end of the positive busbar and an end of the negative busbar that make up the protruded laminated busbar are bent in opposite directions to each other such that internal surfaces at an the end of the positive busbar and the negative busbar having been laminated are opened to provide connecting surfaces; and the DC terminal of the capacitor module is electrically connected to the DC terminal of the power module via the connecting surface of the positive busbar and the connecting surface of the negative busbar.

According to a 9th aspect of the present invention, in the power inverter according to the 8th aspect, it is preferable that each of the capacitor cells comprises a wound film conductor and is arranged such that an outer circumference surface of each of the capacitor cells faces the planar section of the laminated busbar; and each of end faces of the capacitor cells formed with the wound film conductor is electrically connected to the laminated busbar.

According to a 10th aspect of the present invention, in the power inverter according to the 1st to 9th aspects, it is preferable that the DC terminal of the power module includes a laminated busbar made up of a positive busbar and a negative busbar; each of the positive busbar and the negative busbar that make up the laminated busbar, comprises a connection section; the connection section of the positive busbar and the connection section of the negative busbar are bent in opposite directions to each other such that internal surfaces of the positive busbar and the negative busbar having been laminated are opened to provide connecting surfaces at the connection sections; and the DC terminal of the power module is electrically connected to the DC terminal of the capacitor module via the connecting surface of the positive busbar and the connecting surface of the negative busbar.

According to a 11th aspect of the present invention, in the power inverter according to the 7th to 10th aspects, it is preferable that the DC terminal of the power module comprises a laminated busbar made up of a positive busbar and a negative busbar; each of the positive busbar and the negative busbar that make up the laminated busbar, comprises a connection section; the connection section of the positive busbar and the connection section of the negative busbar are bent in opposite directions to each other such that internal surfaces of the positive busbar and the negative busbar having been laminated are opened to provide connecting surfaces at the connection sections; and the connecting surface of the positive busbar and the connecting surface of the negative busbar of the DC terminal of the power module are directly connected to the connecting surface of the positive busbar and the connecting surface of the negative busbar of the DC terminal of the capacitor module, respectively.

According to a 12th aspect of the present invention, in the power inverter according to the 1st to 11th aspects, it is preferable that the power module comprises a AC terminal that is shaped in a plate and protrudes from the power module; the AC terminal is provided with a hole into which a protrusion or a pin provided in a case of the power module is inserted; and the AC terminal is sustained by the protrusion or the pin and the hole against outer vibration to the AC terminal fixed on the case of the power module.

A power inverter according to a 13th aspects of the present invention includes: a coolant passage chassis that comprises an upper cover and a lower cover; a power module, provided in the coolant passage chassis, that comprises a plurality of switching devices used for an inverter circuit, a metal board, shaped in a plate, that releases heat generated by the plurality of the switching devices, a DC terminal, and an AC terminal; a smoothing capacitor module, provided in coolant passage chassis, that comprises a DC terminal which is electrically connected with a DC terminal of the power module; a gate drive circuit, provided in the coolant passage chassis, that drives the power module; and a cooling unit that comprises a coolant passage provided in the coolant passage chassis, wherein: by providing the coolant passage in the cooling unit chassis, a first region is created on one side of the coolant passage and a second region is created on an other side of the coolant passage; the metal board of the power module is fixed on the cooling unit in the first region; the capacitor module is provided in the second region; a space that links the first region and the second region is created on a side of the coolant passage of the cooling unit; and the DC terminal of the capacitor module and the DC terminal of the power module are electrically connected with each other through the space.

According to a 14th aspect of the present invention, in the power inverter according to the 13th aspect, it is preferable that the DC terminal of the capacitor module comprises a laminated busbar that is made up of a positive busbar and a negative busbar, and that protrudes from the capacitor module; a capacitor cell is provided on one side of the laminated busbar in the capacitor module; and the laminated busbar outside the capacitor module extends into the first region through the space that links the first region and the second region, and is connected to the DC terminal of the power module.

According to a 15th aspect of the present invention, in the power inverter according to the 14th aspect, it is preferable that at an end of the DC terminal of the capacitor module, the positive busbar and the negative busbar which make up the laminated busbar, are bent in opposite directions to each other, and each of surfaces of the positive busbar and the negative busbar in the laminated busbar forms a connecting surface; at an end of the DC terminal of the power module, the positive busbar and the negative busbar which make up the laminated busbar, are bent in opposite directions to each other, and each of surfaces of the positive busbar and the negative busbar in the laminated busbar forms a connecting surface; and the connecting surfaces of the DC terminal of the capacitor module and the connecting surfaces of the DC terminal of the power module are connected with each other.

DESCRIPTION OF PREFERRED EMBODIMENTS

Figure 1:
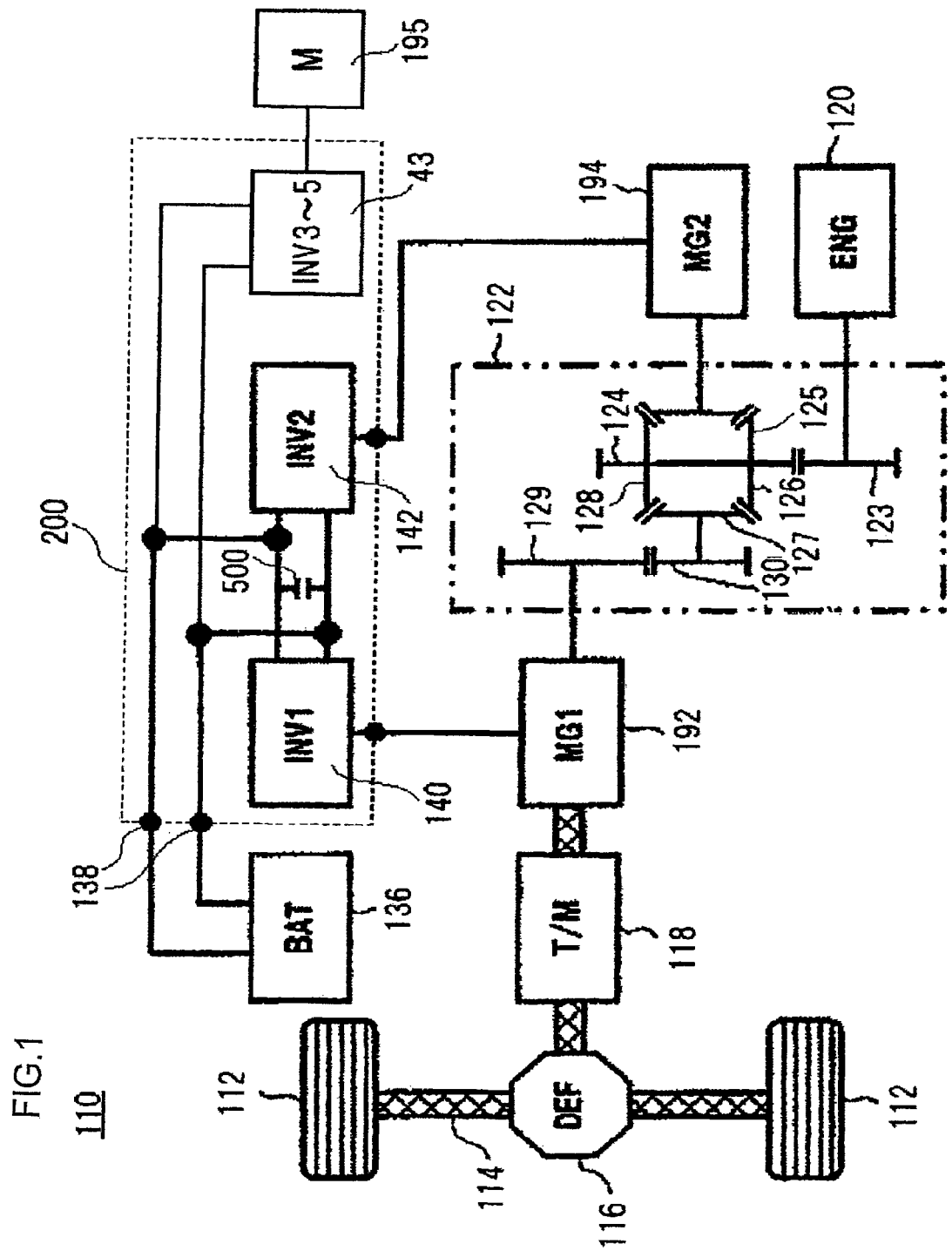
FIG. 1 is a control block diagram that shows a hybrid vehicle.

A power inverter in accordance with embodiments of the present invention will be hereinafter described with reference to the drawings. Technical problems to be improved or solved and technologies for solving the problems will be described first, with regard to the power inverter in accordance with the present embodiment.

[Reduction in Inductance]

There are three measures to take for reducing inductance of electrical circuits: firstly, reduction in inductance of a power module; secondly, reduction in inductance of a capacitor module; and thirdly, reduction in inductance of a connection circuit between the power module and the capacitor module. It is most preferable to implement all the three measures. However, implementing one of the three has effect. Implementing two of the three has more preferable effect than implementing one of the three has.

The first measure, reduction in inductance of the power module, will be described as follows. Semiconductor device chips used for an inverter circuit are incorporated in the power module. The power module is provided with DC terminals for transferring DC electric power. A DC conductor between the DC terminals and the semiconductor devices has a laminated structure in which positive busbar and negative busbar sandwich insulation material. Inductance of the electrical circuit between the DC terminals and the semiconductor devices is considerably reduced by the laminated structure.

Three series circuits are placed parallel inside the power module. Each series circuit includes semiconductor chips for each of upper and lower arms of the inverter circuit. In embodiments hereinafter described, positive and negative terminals for supplying DC electric power to each series circuit are closely placed. Since the positive and negative terminals for supplying DC electric power are closely placed, the flow of electric current is similar to a loop from the positive terminal to the negative terminal through semiconductor chips for each of upper and lower arms. Since the electric current thus flows, eddy current is induced to cooling a metal board of the semiconductor chips. Inductance is reduced by the induction of the eddy current. That is, in embodiments hereinafter described, since the positive and negative terminals for supplying DC electric power to each series circuit, which include upper and lower arms, are closely placed, inductance is reduced.

Positive and negative terminals of the series circuits which include semiconductor chips for each of upper and lower arms are placed in the middle between semiconductor chips for each of upper and lower arms. The semiconductor chip for the upper arm is placed at one side of position of positive and negative terminals, while the semiconductor chip for the lower arm is placed at the other side of it. Electric current thus supplied from the middle between the semiconductor chips and the series circuits placed at both sides facilitate the loop-like flow of electric current. Therefore, characteristics of reducing inductance is obtained.

In the embodiment hereinafter described, as described above, inductance is reduced because of use of laminated busbars between DC terminals of the power module and the positive and negative terminals of the series circuits. Besides, inductance is reduced because of the loop-like flow of electric current through the series circuits. Inside inductance is thus reduced from DC terminals of the power module.

The second measure, reduction in inductance of the capacitor module, will be described as follows. The capacitor module is provided with laminated busbars which include positive and negative busbars. The laminated busbars are provided with a plurality of capacitor cells placed parallel on a planar section. Electrodes at both ends of each capacitor cell are configured to be connected to either the positive busbar or the negative busbar. This configuration enables inductance of the capacitor module to be reduced. In the embodiment described below, the laminated busbars which include the positive and negative busbars protrude from the capacitor module and make up DC terminals of the capacitor module. Since the laminated busbars thus make up the terminals of the capacitor module, inductance is reduced.

The third measure, reduction in inductance of the connection circuit between the power module and the capacitor module, will be described as follows. In the embodiment hereinafter described, since terminals of each of the power module and the capacitor module have the laminated structure and are directly connected with each other, inductance of the connection circuit between the power module and the capacitor module is reduced.

It is most preferable for the power module and the capacitor module to be directly connected as mentioned above. Even if they are not directly connected with each other, however, inductance is reduced by connecting DC terminals of the power module and the capacitor module using laminated busbars which include positive and negative busbars.

It is preferable to reduce inductance of each connection in which the power module and the capacitor module are directly connected or for which laminated busbars are used. In the embodiment hereinafter described, the connection is configured as follows. Laminated busbars of positive and negative terminals are bent in the opposite direction to each other. Internal surface of each laminated busbar is exposed to be a connecting surface. The connecting surface is connected with other connecting surface of a counterpart. This configuration greatly reduces inductance of the connection and enables inductance between the power module and the capacitor module to be considerably reduced.

[Descriptions Related to Miniaturization of Power Inverter]

Efforts for miniaturization of the power inverter will be described by following five respects. 1. Miniaturization of the power inverter through cooling the power inverter using both sides of a coolant passage placed at the midpoint of a chassis of the power inverter. 2. Miniaturization of the power inverter by creating a space between the side of the coolant passage and the chassis for electrical connection between the power module and the capacitor module. 3. Miniaturization of the power inverter through simplified wiring by parallel placement of two power modules along the coolant passage. 4. Structural improvement of the power module. 5. Structural improvement of the capacitor module. Each of the above efforts has effect. Combining these efforts brings about greater advantageous effects.

The first effort will be detailed as follows. In the embodiment hereinafter described, the coolant passage is placed at the midpoint of a chassis of the power inverter for cooling the power inverter using both sides of the coolant passage. This configuration improves cooling efficiency for miniaturization. The power module is placeable on one side of the coolant passage and the capacitor module is placeable on the other side. These placements reduce the volume necessary for cooling of the power module and the capacitor module and result in miniaturization of the power inverter.

Other measures for miniaturization of the power inverter include placement of a gate drive circuit for driving semiconductor devices in the power module on the side of the coolant passage where the power module is placed. This realizes simplification of connection between the power module and a gate drive circuit.

Further measures for miniaturization of the power inverter include placement of the power module on one side of the coolant passage and placement of an inverter device for auxiliaries on the other side. These placements improve cooling efficiency and result in miniaturization of the power inverter. The inverter device for auxiliaries described above includes an inverter device for a driving motor for an on-vehicle air conditioner and an inverter device for an oil pump motor. By placing an inverter device for auxiliaries and the capacitor module on the other side of the coolant passage, the capacitor module is used as a smoothing capacitor for an electric rotating machine for a vehicle and as a smoothing capacitor for the inverter for auxiliaries. Thus, circuit configuration is simplified and the power inverter is miniaturized.

The second effort will be detailed as follows. The coolant passage is provided along one side of a substantially rectangular chassis. A hole, or a through-space, that links spaces on both sides of the coolant passage is provided between the chassis and the side of the passage perpendicular to the above-mentioned one side of the chassis. Electrical components provided on one side of the coolant passage and electrical components provided on the other side of the coolant passage are electrically connected with each other through the hole, or the through-space. Necessary electrical connection thus made through the hole, or the through-space, results in simplification of the connection and miniaturization of power inverter.

The third effort will be detailed as follows. In the embodiment hereinafter described, the coolant passage is provided along one side of the substantially rectangular chassis. Two power modules are placed along the coolant passage. The terminals on DC side and terminals on AC side of the two power modules are provided in the direction perpendicular to the coolant passage. This configuration enables the space between the coolant passage and the chassis to be utilized for placement of the terminals and results in miniaturization of the power inverter. Since the terminals of the two power modules are placed in the direction perpendicular to the two parallel power modules, they are less likely to interfere with each other. Thus, the power inverter is miniaturized. As described above, since the terminals on DC side of the two power modules are placed between the coolant passage and the chassis, the through-space that links both sides of the coolant passage is provided between the chassis and the coolant passage on the side of the terminals on DC side of the power module. The terminals on DC side of the power module on one side of the coolant passage and the terminals on DC side of the capacitor module are connected through the through-space. Simplification of wiring, miniaturization of the power inverter, and improvement in reliability are thus realized.

The fourth effort for miniaturization of the power module will be detailed as follows. Each of the hereinafter-described two power modules is provided with series circuits that include upper and lower arms of the inverter circuit which correspond to U-phase, V-phase, and W-phase of three-phase AC. Since the series circuits are provided parallel, orderly placement of semiconductor chips of each of the series circuits is realized.

In the embodiment hereinafter described, the semiconductor devices which make up the inverter circuit are fixed to a metal plate for cooling through insulating layer. The DC conductor that supplies DC electric power to the power module is supplied on the semiconductor devices. That is, the metal plate for cooling is provided on one side of the semiconductor devices and the DC conductor is provided on the other side of the semiconductor devices. This configuration brings about miniaturization of the power module which results in miniaturization of the power inverter.

In the embodiment hereinafter described, terminals on AC side protrude from the power module and are used as AC output terminals of the power inverter. This configuration reduces the number of components and results in productivity improvement and miniaturization of the power inverter.

The fifth effort, improvement of the capacitor module, will be detailed as follows. The capacitor module includes a plurality of capacitor cells placed on the positive and negative laminated busbars. Positive and negative terminals of each capacitor cell are electrically connected to the positive and negative busbars. Additional plurality of capacitor cells are placed on the laminated busbars on which the capacitor cells are fixed. Small-sized large-capacity capacitor module is thus realized. Miniaturization of capacitor module brings about miniaturization of power inverter.

A film capacitor, which includes a film and a thin insulating member wound or rolled up, is used for a capacitor cell. The film capacitor is fixed so that its outer circumference surface faces the surface of the laminated busbars. This results in a miniaturized, vibration-resistant, and reliable capacitor module.

A plurality of capacitor cells are placed along the long side of the laminated busbars. Electrodes of the capacitor cells are placed along the short side of the busbars. This configuration results in easier connection between the capacitor cells and the busbars and improves productivity.

The following embodiment achieves further advantageous effects. Other problems to be solved by the embodiment will be described below.

[Reliability Improvement]

In the embodiment hereinafter described, the through-space is provided between the side of the coolant passage and the chassis for connection between the power module and the capacitor module. Since the connection is made through the through-space which is provided in a different location from that the coolant passage is, it is less susceptible to the coolant. This improves reliability.

Separation of solder fixing between the AC busbars and the power module board caused by vibration of the motor generator is prevented by connecting the AC busbars of U-phase, V-phase, and W-phase, which are AC output terminals of the power module, to a motor generator through pins. Reliability of the power inverter is thus improved. Workability and assembly productivity are also improved by pin coupling, an easy coupling method.

[Productivity Improvement]

A Chassis of cooling section is provided with a space for enclosing a DC connecting terminal structure for connection between the power module and the capacitor, in addition to a coolant space for the coolant passage for cooling a cooling fin of the power module. Covering the connecting terminal structure with the chassis results in simplification and miniaturization of the overall structure of the power inverter and improvement in assembly productivity. Coolant in the coolant space contributes to capacitor cooling through the chassis of cooling section.

Connecting ends of the power module and the capacitor extend and are directly connected with each other without any particular connecting members. This configuration contributes to a simplified connecting terminal structure, miniaturization of the power inverter, and improvement in both workability and assembly productivity.

[Improvement of Cooling Efficiency]

The power inverter in accordance with the present embodiment contains series circuits of the upper and lower arms of the inverter device inside the power module (semiconductor module) which includes a cooling fin on one side, the power module inserted in cooling section, and the cooling fin directly cooled by the coolant. The power inverter employs a laminated structure in which the power module and the smoothing capacitor for a DC power supply are contained in the chassis of the cooling section where the coolant passage is provided, in other words, a sandwich structure in which the coolant passage is sandwiched in between the power module and the capacitor. Cooling efficiency is thus improved to miniaturize the power inverter.

Coolant is poured into the coolant passage from the short side of the rectangular chassis. The coolant passage extends along one of the long sides of the rectangular chassis and turns around to come back along the other long side of the rectangular chassis. The two power modules are cooled by the coolant passage in both directions along the both of the long sides. This configuration improves cooling efficiency. Locations of the chips which make up the upper and the lower arms of the inverter circuit correspond to the both directions of the coolant passage. This configuration improves cooling efficiency. The improvement of cooling efficiency contributes to improvement of reliability and miniaturization of the device. Above descriptions are related to advantageous effects and problems to be solved in the embodiment of the present invention. The present embodiment will be detailed hereinafter.

Figure 2:
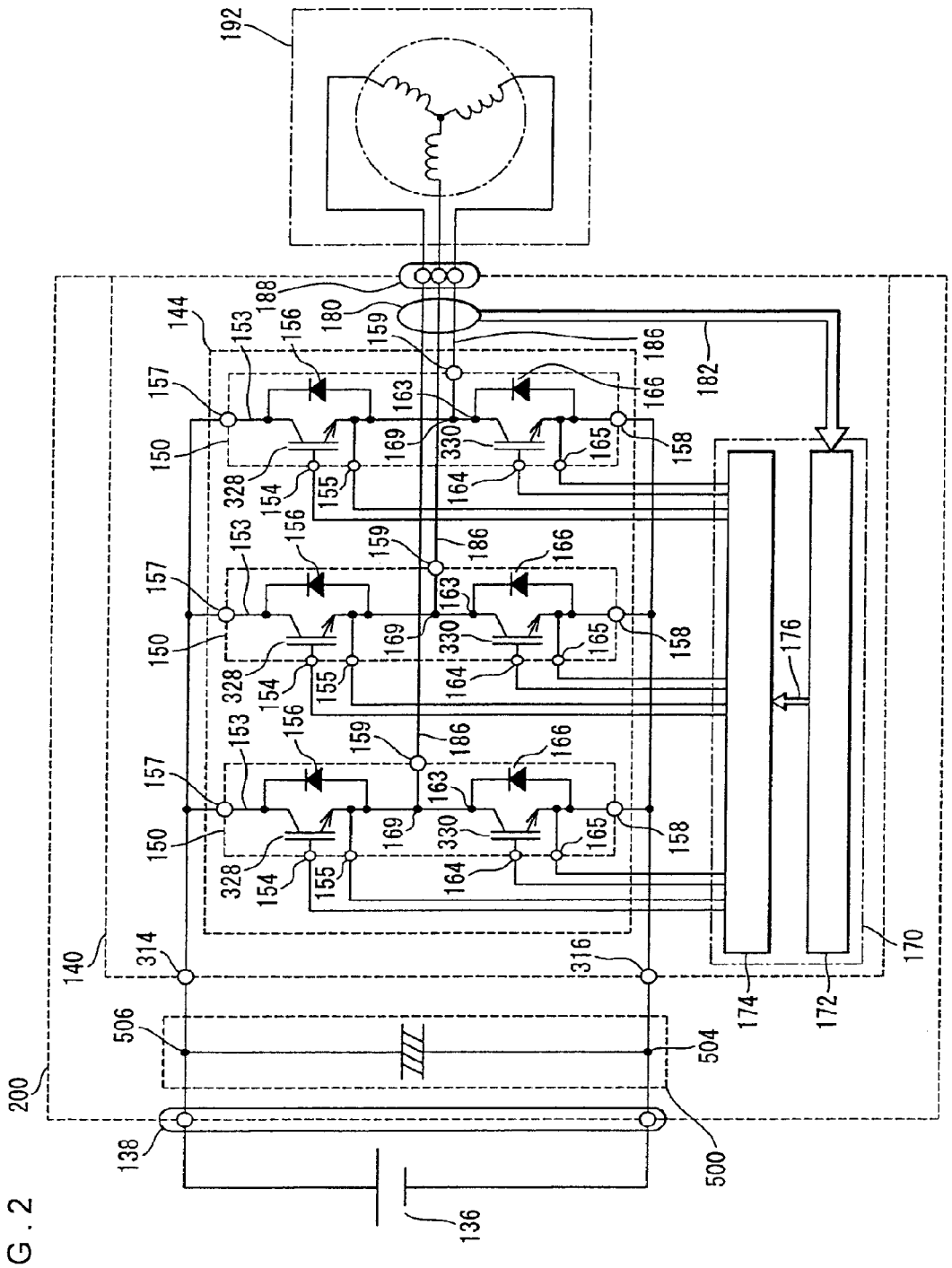
FIG. 2 is a circuit diagram that shows an electric system for driving a vehicle.

The power inverter in accordance with the embodiment of the present invention will be hereinafter detailed with reference to the drawings. The power inverter in accordance with the embodiment of the present invention is applicable to hybrid vehicles and ordinary electric vehicles. The control configuration and the circuit configuration of the power inverter to which the power inverter in accordance with the embodiment of the present invention is applied will be described with reference to the FIGS. 1 and 2. FIG. 1 shows a control block diagram for a hybrid vehicle. FIG. 2 is a circuit diagram that shows an electric system for driving a vehicle that includes the power inverter, a battery and a motor generator. The power inverter includes an inverter unit provided with series circuits of upper and lower arms and a control unit, and a capacitor module that is connected to DC side of the inverter unit.

The power inverter in accordance with the embodiment of the present invention will be described with an example of an in-vehicle power inverter of in-vehicle electric system to be mounted on a vehicle, particularly an inverter device for driving a vehicle that is used for an electric system for driving a vehicle in a challenging environment in terms of installation and operation. The inverter device for driving a vehicle is mounted on the electric system for driving a vehicle as a control device for controlling drive of electric machine for driving a vehicle, converts DC electric power which is supplied from an in-vehicle battery or power generating equipment into AC electric power, supplies the obtained AC electric power to the electric machine for driving a vehicle, and thus controls drive of the electric machine for driving a vehicle. Since the electric machine for driving a vehicle includes function as a generator, the inverter device for driving a vehicle converts AC electric power generated by the electric machine for driving a vehicle into DC electric power depending on operation mode. The converted DC electric power is supplied to the in-vehicle battery.

The configuration of the present embodiment is most appropriate for power inverters for driving vehicles such as automobiles and trucks. However, it is also applicable to other power inverters including power inverters for trains, ships, and airplanes, industrial power inverters used as a control device for electric machine which drives plant, or household power inverters used as a control device for electric machine which drives household solar power system or consumer electronics.

In FIG. 1, a hybrid electric vehicle (HEV) 110 is an electric vehicle provided with two systems for a driving vehicle. One of the systems is an engine system powered by an internal combustion engine 120. The engine system is mainly used as a drive source for HEV. The other system is an in-vehicle electric system powered by motor generators 192 and 194. The in-vehicle electric system is mainly used as a drive source or a power generation source for HEV. Each of the motor generators 192 and 194 is, for example, a synchronous machine or an induction machine, which is operated either as a motor or as a generator depending on operation mode.

A front axle 114 is rotatably supported in a front part of the vehicle body. A pair of front wheels 112 are provided on both ends of the front axle 114. A rear axle (not herein figured) is rotatably supported in a rear part of the vehicle body. A pair of rear wheels (not herein figured) are provided on both ends of the rear axle. Even though a front-wheel drive system, in which main wheels powered by the engine are set to the front wheels 112 while driven wheels subordinated are set to the rear wheels, is applied to the HEV in the present embodiment, a rear-wheel drive system may be applied.

A front differential gear (Front DEF) 116 is provided in the center of the front axle 114. The front axle 114 is mechanically connected to an output side of the front DEF 116. An input side of the front DEF 116 is mechanically connected to an output shaft of a transmission 118. The front DEF 116 is a differential power transfer mechanism that distributes a rotational driving force with its speed reduced and transferred by the transmission 118 to the front axle 114 in right and left. Input of the transmission 118 is mechanically connected to output of the motor generator 192. An input side of the motor generator 192 is mechanically connected to an output side of the engine 120 and output of the motor generator 194 via a power transfer mechanism 122. The motor generators 192 and 194 and the power transfer mechanism 122 are contained in a chassis of the transmission 118.

The power transfer mechanism 122 is a differential mechanism made up of gears 123 to 130. The gears 125 to 128 are bevel gears. The gears 123, 124, 129, and 130 are spur gears. Power by the motor generator 192 is directly transferred to the transmission 118. An axis of the motor generator 192 is coaxial with the gear 129. This configuration makes the power transferred to the gear 129 directly transferred to the input side of the transmission 118, in the case when no electric power is supplied to the motor generator 192.

When the gear 123 is driven by the engine 120, the power of the engine 120 is transferred from the gear 123 to the gear 124, from the gear 124 to the both of the gears 126 and 128, from the both of the gears 126 and 128 to the gear 130, and lastly transferred to the gear 129. When the gear 125 is driven by the motor generator 194, rotation of the motor generator 194 is transferred from the gear 125 to the both of the gears 126 and 128, from the both of the gears 126 and 128 to the gear 130, and lastly transferred to the gear 129. For the power transfer mechanism 122, other mechanisms including a planetary gear mechanism may be applied in place of the differential mechanism described above.

Each of the motor generators 192 and 194 is the synchronous machine with permanent magnets in its rotor. Drive of the motor generators 192 and 194 is controlled by inverter devices 140 and 142 that control AC electric power supplied to armature coils of a stator of the motor generators 192 and 194. Since the inverter devices 140 and 142 are electrically connected to a battery 136, electric power is transferable between the battery 136 and each of the inverter devices 140 and 142.

In the present embodiment, a first motor-generator unit made up of the motor generator 192 and the inverter device 140 and a second motor-generator unit made up of the motor generator 194 and the inverter device 142 are provided and selectively used depending on the state of operation. In other words, in the case of assisting drive torque when the vehicle is driven by the power of the engine 120, the second motor-generator unit is operated as a generating unit by the power of the engine 120 for generating electric power, and the first motor-generator unit is operated as a motor unit by the electric power generated by the second motor-generator unit. In the case of assisting vehicle speed when the vehicle is driven by the power of the engine 120, the first motor-generator unit is operated as a generating unit by the power of the engine 120 for generating electric power, and the second motor-generator unit is operated as a motor unit by the electric power generated by the first motor-generator unit.

In the present embodiment, operating the first motor-generator unit as a motor unit by the electric power of the battery 136 enables the vehicle to be driven only by the power of the motor generator 192. In the present embodiment, the battery 136 is recharged by operating either the first motor-generator unit or the second motor-generator unit as a generating unit by either the power of the engine 120 or wheels.

The battery 136 is used as a battery for driving a motor 195 for auxiliaries. The auxiliaries include, for example, a motor for driving an air-conditioning compressor and a motor for driving a control hydraulic pump. DC electric power is supplied from the battery 136 to an inverter device 43, converted into AC electric power by the inverter device 43, and supplied to the motor 195. The inverter device 43 is provided with a similar function to that of the inverter devices 140 and 142, and controls phase, frequency and electric power of AC supplied to the motor 195. The motor 195 generates torque, for example, by supplying AC electric power of leading phase to rotation of a rotor of the motor 195. On the other hand, the motor 195 acts as an electric generator and operates regenerative braking, by generating AC electric power of lagging phase. The control function of the inverter device 43 is similar to that of the inverter device 140 or 142. Since capacity of the motor 195 is smaller than that of the motor generator 192 or 194, maximum conversion electric power of the inverter device 43 is smaller than that of the inverter device 140 or 142. Circuit configuration of the inverter device 43, however, is basically the same as that of the inverter device 140 or 142.

The inverter devices 140, 142, and 43, and a capacitor module 500 are in an electrically close relation between themselves, and commonly require measures against the heat and miniaturization of the devices. The power inverter detailed below thus contains the inverter devices 140, 142, and 43, and the capacitor module 500 in its chassis. This configuration realizes a small and reliable device.

Containing the inverter devices 140, 142, and 43, and the capacitor module 500 in the single chassis have advantageous effects in simplification of wiring and noise filtering. Inductance of the connection circuits between the capacitor module 500 and each of the inverter devices 140, 142, and 43 can also reduced. Spike voltage and the heat are also reduced. Heat generation is reduced and radiation efficiency is thus improved.

Electric circuit configurations of the inverter devices 140, 142, and 43 will be described below with reference to FIG. 2. The inverter devices 140, 142, and 43 have similar configurations, advantageous effects, and functions in common. In the following explanation, therefore, the inverter device 140 will be described as a representative example.

A power inverter 200 in accordance with the present embodiment is provided with the inverter device 140 and the capacitor module 500. The inverter device 140 is provided with an inverter circuit 144 and a control unit 170. The inverter circuit 144 is provided with a plurality of upper and lower arms series circuits 150 including an IGBT (insulated gate bipolar transistor) 328 and a diode 156 which operate as the upper arm and an IGBT 330 and a diode 166 which operate as the lower arm. Three of the upper and lower arms series circuits 150, 150, and 150 are illustrated in FIG. 2. The inverter circuit 144 is connected to the motor generator 192 at midpoints of the upper and lower arms series circuits 150 (intermediate electrodes 169), which are connected to AC electric power lines (AC busbars) 186 of the motor generator 192 via AC terminals 159. The control unit 170 includes a gate drive circuit 174 which drives and controls the inverter circuit 144, and a control circuit 172 which supplies control signal to the gate drive circuit 174 through a signal line 176.

The IGBTs 328 and 330 of the upper and lower arms are switching power semiconductor devices which are operated in response to drive signals output from the control unit 170 and convert DC electric power supplied from the battery 136 into three-phase AC electric power. The converted electric power is supplied to the armature coil of the motor generator 192. As described above, the inverter device 140 converts three-phase AC electric power generated by the motor generator 192 into DC electric power.

As shown in FIG. 1, the power inverter 200 in accordance with the present embodiment is provided with the inverter devices 140, 142, and 43, and the capacitor module 500. As described above, since the inverter devices 140, 142, and 43 have circuit configurations in common, the inverter device 140 is mentioned as a representative example and the others are not mentioned.

The inverter circuit 144 is made up of a three-phase bridge circuit wherein the upper and lower arms series circuits 150, 150, and 150 for three phases are electrically connected in parallel between a DC positive terminal 314 and a DC negative terminal 316 that are electrically connected to the positive and negative terminals of the battery 136 respectively. The upper and lower arms series circuit 150 is called an arm and provided with the upper arm switching power semiconductor device 328, the diode 156, the lower arm switching power semiconductor device 330, and the diode 166.

In the present embodiment, the switching power semiconductor devices are illustrated by an example of the IGBTs 328 and 330. The IGBTs 328 and 330 are provided with collectors 153 and 163, emitters (signal emitter terminals 155 and 165), and gate electrodes (gate electrode terminals 154 and 164). As Figured, the diodes 156 and 166 are electrically connected between each of the collectors 153 and 163 and the emitters of the IGBTs 328 and 330, respectively. The diodes 156 and 166 are provided with two electrodes, i.e., cathode and anode electrodes. The cathode and anode electrodes are electrically connected to the collectors and emitters of the IGBTs 328 and 330 respectively so that the direction from the emitters to the collectors of the IGBTs 328 and 330 is forward direction. A MOSFET (metal-oxide semiconductor field-effect transistor) may be employed for the switching power semiconductor device which makes the diodes 156 and 166 unnecessary.

The upper and lower arms series circuits 150 are provided for three phases corresponding to each phase coil of the armature coil of the motor generator 192. Each of the three upper and lower arms series circuits 150 makes up either one of the U-phase, V-phase, or W-phase for the motor generator 192 through the intermediate electrodes 169 which connect the emitters of the IGBTs 328 with the collectors 163 of the IGBT 330 and the AC terminals 159. The upper and lower arms series circuits 150 are electrically connected in parallel between each other. The collectors 153 of the IGBTs 328 of the upper arm and the emitters of the IGBTs 330 of the lower arm are electrically connected by DC busbar to a positive electrode of the capacitor module 500 via the positive electrode terminal (P terminal) 157 and to a negative electrode of the capacitor module 500 via the negative electrode terminal (N terminal) 158, respectively. The intermediate electrodes 169, that is, the midpoints of each of the arms (connection of the emitters of the IGBTs 328 of the upper arm and the collectors of the IGBTs 330 of the lower arm), are electrically connected to the phase coil which corresponds to the armature coil of the motor generator 192 through an AC connector 188.

The capacitor module 500 constitutes a smoothing circuit which reduces fluctuation in DC voltage generated by switching operation of the IGBTs 328 and 330. The positive electrode and the negative electrode of the capacitor module 500 are electrically connected to positive and negative sides of the battery 136 through a DC connector 138 respectively. The capacitor module 500 is thus electrically connected in parallel to the battery 136 and the upper and lower arms series circuits 150 at both between the collectors 153 of the upper arm IGBTs 328 and the positive terminal side of the battery 136 and between the emitters of the lower arm IGBTs 330 and the negative terminal side of the battery 136.

The control unit 170 is designed to operate the IGBTs 328 and 330 and includes the control circuit 172 which generates a timing signal for controlling switching timing of the IGBTs 328 and 330 in accordance with information input from other control devices or sensors, and a drive circuit 174, which generates a drive signal for switching operation of the IGBTs 328 and 330 in accordance with the timing signal output from the control circuit 172.

The control circuit 172 is provided with a microcomputer for computational processing of the switching timing of the IGBTs 328 and 330. The microcomputer is provided with input information including a target torque required for the motor generator 192, a current value supplied from the upper and lower arms series circuits 150 to the armature coil of the motor generator 192, and a magnetic pole position of the rotor of the motor generator 192. The target torque is set in accordance with a command signal output from a superordinate control device not figured herein. The current value is detected in accordance with a detection signal output from a current sensor 180. The magnetic pole position is detected based on a detection signal output from a rotating magnetic pole sensor (not Figured herein) provided in the motor generator 192. In the present embodiment, description will be given with an example of detection of three-phase current value. Two-phase current value, however, may instead be detected.

The microcomputer in the control circuit 172 calculates a current command value of d- and q-axis of the motor generator 192 in accordance with the target torque, calculates a voltage command value of the d- and q-axis in accordance with the difference between the calculated current command value of the d- and q-axis and a detected current value of the d- and q-axis, and converts the calculated voltage command value of the d- and q-axis into a voltage command value for U-phase, V-phase, and W-phase in accordance with the detected magnetic pole position. The microcomputer generates a pulse modulated wave according to comparison of a fundamental wave (sine wave) based on the voltage command value for U-phase, V-phase, and W-phase with a carrier wave (triangle wave), and outputs the generated modulated wave to the gate drive circuit 174 as a pulse-width modulation (PWM) signal.

When the lower arm is driven, the gate drive circuit 174 amplifies and outputs the PWM signal as a drive signal to the gate electrodes of the IGBTs 330 of the corresponding lower arm. When the upper arm is driven, the gate drive circuit 174 shifts from a reference potential level of the PWM signal to a reference potential level of the upper arm, amplifies and outputs the amplified PWM signal as a drive signal to the gate electrodes of the IGBTs 328 of the corresponding upper arm. Each of the IGBTs 328 and 330 performs switching operation in response to the input drive signals.

The control unit 170 detects abnormality (overcurrent, overvoltage, over temperature, etc.) for protecting the upper and lower arms series circuits 150. Consequently, sensing information is input to the control unit 170. For example, information on electric current which flows to the emitters of each of the IGBTs 328 and 330 is input through the signal emitter terminals 155 and 165 of each arm to a corresponding drive unit (IC). Each drive unit (IC) thus detects overcurrent, stops switching operation of the corresponding IGBTs 328 and 330 in the case overcurrent is detected, and protects the corresponding IGBTs 328 and 330 from overcurrent. Temperature information of the upper and lower arms series circuits 150 is input from a temperature sensor (not Figured herein) provided in the upper and lower arms series circuits 150 to the microcomputer. Voltage information of positive side of DC of the upper and lower arms series circuits 150 is input to the microcomputer. The microcomputer detects over temperature and overvoltage based on those information, stops all switching operations of the IGBTs 328 and 330 in the case over temperature or overvoltage is detected, and protects the upper and lower arms series circuits 150 and therefore the semiconductor module which includes the circuits 150 from over temperature or overvoltage.

In FIG. 2, the upper and lower arms series circuits 150 are series circuits which include the IGBTs 328 of the upper arm, the diodes 156 of the upper arm, the IGBTs 330 of the lower arm, and the diodes 166 of the lower arm, wherein the IGBTs 328 and 330 are the switching semiconductor devices. Conduction operation and interrupting operation of the IGBTs 328 and 330 of the upper and lower arms of the inverter circuit 144 alternate constantly. Electric current through the stator coil of the motor generator 192 at the alternation flows through a circuit includes the diodes 156 and 166.

As illustrated, the upper and lower arms series circuit 150 is provided with the positive terminal (P terminal) 157, the negative terminal (N terminal) 158, the AC terminals 159 from the intermediate electrode 169 of the upper and lower arms, the signal emitter terminal 155 of the upper arm, the gate electrodes terminal 154 of the upper arm, the signal emitter terminal 165 of the lower arm, and the gate electrodes terminal 164 of the lower arm. The power inverter 200 is provided with the DC connector 138 on its input side and the AC connector 188 on its output side, and is connected to each of the battery 136 and the motor generator 192 via each of the connectors 138 and 188. A power inverter with circuit configuration in which two of the upper and lower arms series circuits are connected in parallel to each phase may be employed for a circuit that generates outputs of each phase of the three-phase AC which is output to the motor generator.

Figure 3:
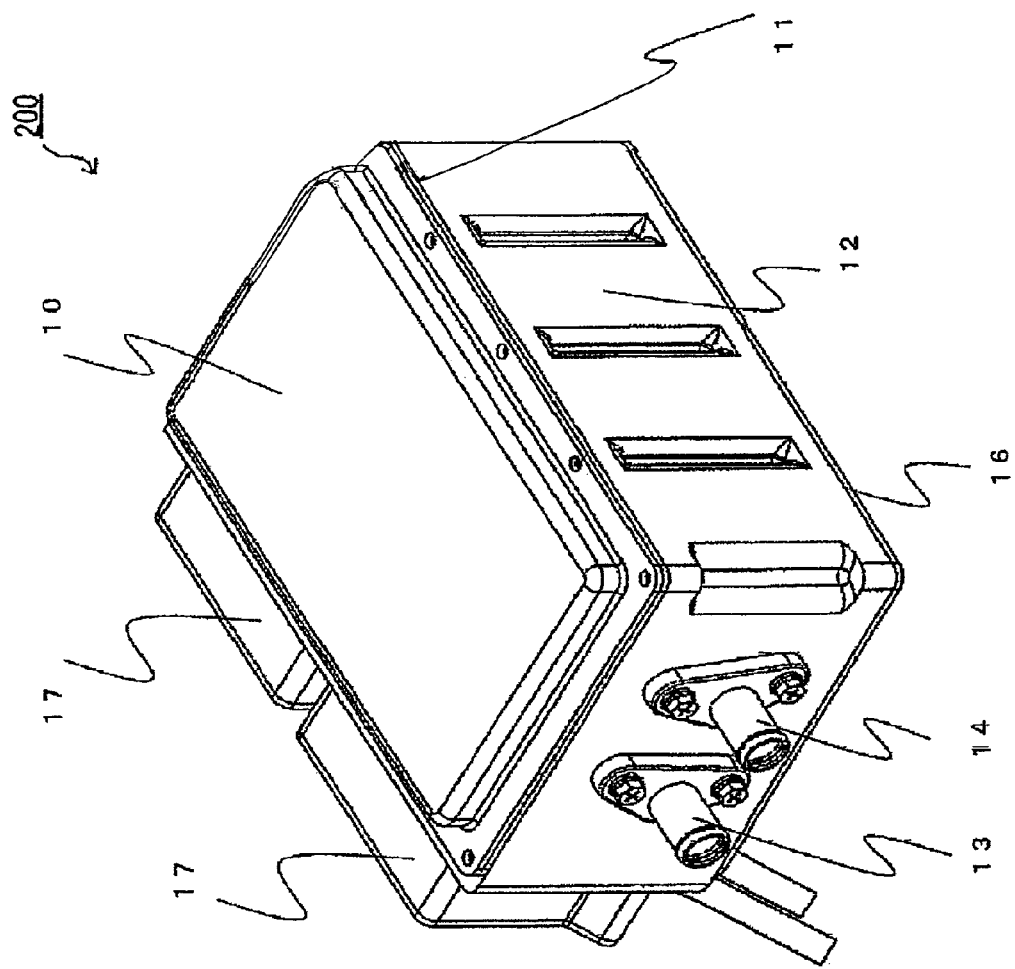
FIG. 3 is an external perspective view of an entire configuration of a power inverter in accordance with an embodiment of the present invention.
Figure 4:
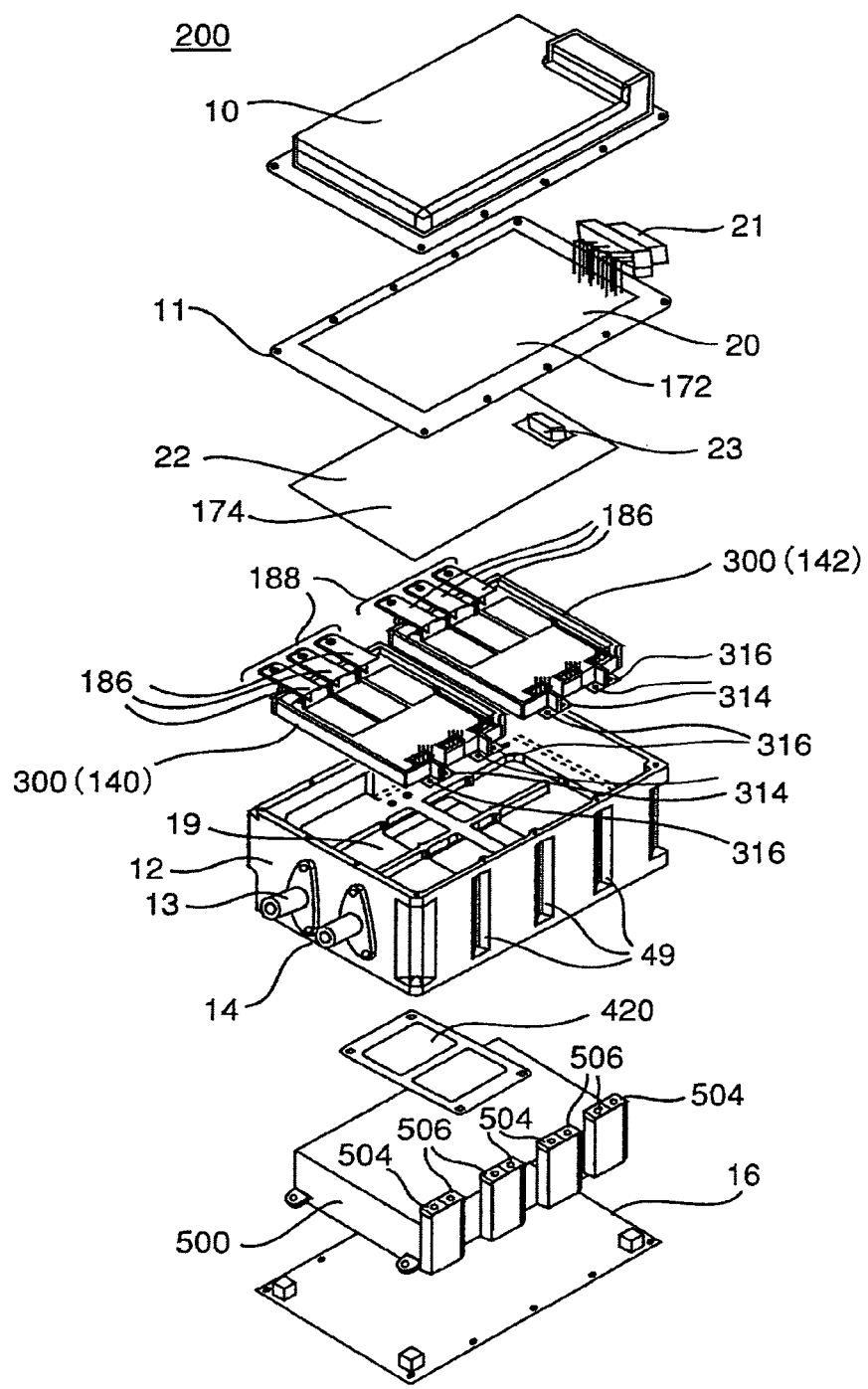
FIG. 4 is an exploded perspective view of the entire configuration of the power inverter in accordance with the embodiment of the present invention.
Figure 5:
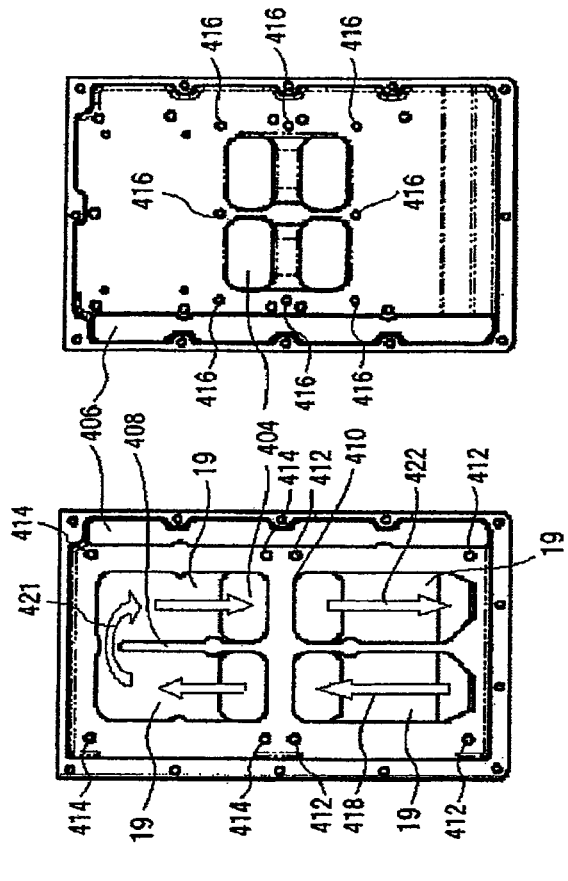
FIGS. 5A to 5C show a chassis and illustrate flow of coolant in a coolant passage.
Figure 6:
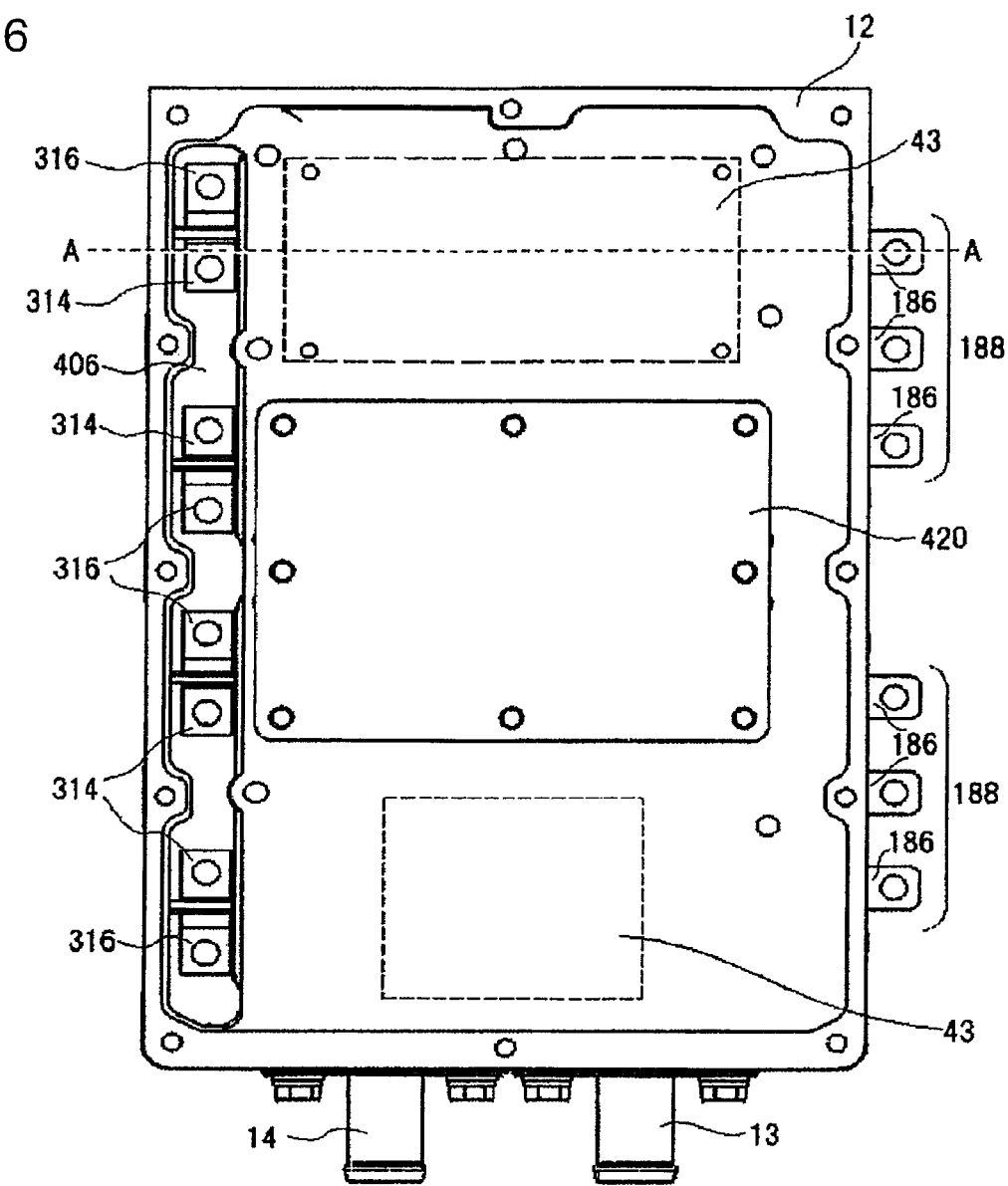
FIG. 6 is a bottom view of the chassis in which a power module that relates to the present embodiment is mounted.
Figure 7:
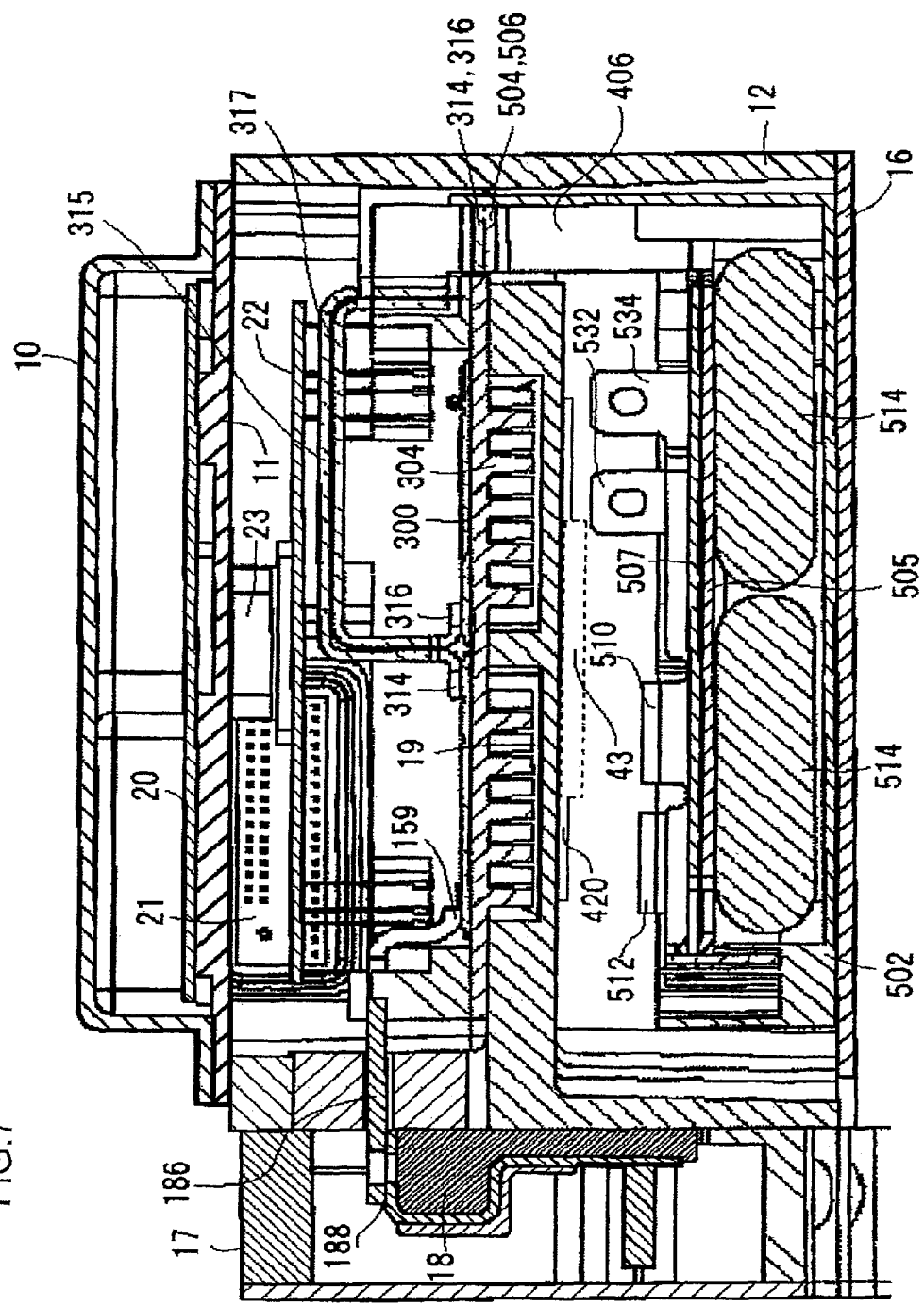
FIG. 7 is a cross-sectional view of the entire configuration of the power inverter shown in FIGS. 3 and 4 which relates to the present embodiment.

The entire configuration of the power inverter 200 shown in FIGS. 1 and 2 will be hereinafter described with reference to FIGS. 3 to 7. A same reference number is given to the same component among FIGS. 1 to 7. Description for a component already described will be omitted. FIG. 3 is an external perspective view of an entire configuration of the power inverter 200. FIG. 4 is an exploded perspective view of the entire configuration of the power inverter 200 in accordance with the present embodiment. FIGS. 5A to 5C are the illustrations of the chassis which is a housing of the power inverter shown in FIGS. 3 and 4, and the coolant passage provided in the chassis. FIG. 6 is a bottom view of the chassis in which the coolant passage is seen from the bottom. FIG. 7 is a cross-sectional view of the power inverter 200, which shows cross-sectional surface of A-A in FIG. 6 seen from the top of the FIG. 6.

In FIGS. 3 to 7, each component is numbered as follows: power inverter 200; upper cover 10; metal board 11; chassis 12; coolant inlet 13; coolant outlet 14; cover 420; lower cover 16; AC terminal case 17; AC terminal 18; coolant passage 19; control circuit board 20 which holds the control circuit 172 shown in FIG. 2; connector 21 for connection with outside; and gate drive circuit board 22 which holds the gate drive circuit 174 shown in FIG. 2; interboard connector 23 for electrical connection between the control circuit 172 on the control circuit board 20 and the signal line 176 shown in FIG. 2 (the signal line 176 is not Figured in FIGS. 3 to 7); power module 300 (semiconductor module unit), each of which has built-in inverter circuit 144 shown in FIG. 2; power module case 302; metal board 304; AC connector 188; DC positive terminal 314; DC negative terminal 316; casting slots 49; capacitor module 500; capacitor case 502; positive capacitor terminal 504; negative capacitor terminal 506; and, capacitor cells 514, respectively.

The power inverter 200 in accordance with the present embodiment is roughly provided with the power module (semiconductor module unit) 300 that converts between DC electric power and AC electric power, the capacitor module 500 for voltage smoothing of DC power, and the coolant passage 19 for cooling, for example, the power module 300. As shown in FIG. 3, the external of the power inverter 200 in accordance with the present embodiment includes the chassis 12 with substantially rectangular top or bottom surface, the coolant inlet 13 and the coolant outlet 14 provided on one of the short sides of the chassis 12, the upper cover 10 for covering an upper opening of the chassis 12, and the lower cover 16 for covering a lower opening of the chassis 12. Two AC terminal cases 17 for connection to the motor generator 192 or 194 are mounted on one of the long sides of the power inverter 200. The substantially rectangular top or bottom surface of the chassis 12 realizes easier mounting on vehicles and higher productivity. It is to be noted that a connector 21 which is shown in FIG. 4 is omitted in FIG. 3 to show the rectangular shape of the chassis 12.

As shown in FIG. 4, the coolant passage 19 is provided in the chassis 12. Openings 400 and 402 are formed along the flow of the coolant over the coolant passage 19. Two power modules 300 are fixed over the coolant passage 19 so that each of the openings 400 and 402 is covered with the power module 300. Each of the power module 300 is provided with the cooling fin 305 that protrudes into the flow of the coolant through the openings 400 and 402 of the coolant passage 19.

Openings 404 are formed under the coolant passage 19 for easier aluminum casting. The openings 404 are covered with a cover 420. The inverter device 43 for auxiliaries is provided beneath the coolant passage 19. The inverter device 43 for auxiliaries is provided with a built-in circuit similar to the inverter circuit 144 shown in FIG. 2 and a power module provided with built-in power semiconductor device which makes up the inverter circuit 144. The inverter device 43 for auxiliaries is fixed beneath the coolant passage 19, with a cooling metal surface of the built-in power module facing the bottom surface of the coolant passage 19.

The lower cover 16 for heat dissipation is provided under the coolant passage 19 and provided with the capacitor module 500, with the cooling surface of a metal case of the capacitor module 500 facing and fixed on the surface of the lower cover 16. This configuration realizes efficient cooling using top and bottom surfaces of the coolant passage 19, resulting in miniaturization of the entire power inverter.

The flow of the coolant in the coolant passage 19 through the inlet 13 and the outlet 14 cools the cooling fin 305 included in the two parallel power modules 300 and thus cools the two power modules 300 overall. At the same time, the inverter device 43 for auxiliaries, which is provided beneath the coolant passage 19, is cooled.

The lower cover 16, provided under the chassis 12, is cooled as the chassis 12 provided with the coolant passage 19 is cooled. The heat of the capacitor module 500 is thus conducted to the coolant via the lower cover 16 and the chassis 12, resulting in cooling of the capacitor module 500.

In the present embodiment, in the chassis 12, the DC positive busbars 314 and the DC negative busbars 316 of the power module 300 are directly, electrically, and mechanically connected to the positive terminals 504 and the negative terminals 506 of the capacitor module 500 respectively. A through-hole 406 is formed for this connection.

The control circuit board 20 and the gate drive circuit board 22 are provided over the power module 300. The gate drive circuit 174 shown in FIG. 2 is mounted on the gate drive circuit board 22. The control circuit 172 with CPU shown in FIG. 2 is mounted on the control circuit board 20. The metal board 11 is placed between the gate drive circuit board 22 and the control circuit board 20 as an electromagnetic shield for circuits mounted on the both boards 22 and 20 for cooling the both boards 22 and 20 by transferring heat generated by the both boards 22 and 20. Efficient cooling with small space and miniaturization of the overall power inverter are achieved by placing the coolant passage 19 in the center of the chassis 12, the power module 300 for driving a vehicle on one side of the coolant passage 19, and the inverter device 43 for auxiliaries on the other side. Main mechanism of the coolant passage 19 is formed with aluminum casting together with the chassis 12 for better cooling effect and mechanical strength of the coolant passage 19. Forming with the aluminum casting realizes integral structure of the chassis 12 and the coolant passage 19, resulting in better heat transfer and cooling effect.

The gate drive circuit board 22 is provided with the interboard connector 23 for connection with the circuits on the control circuit board 20 through the metal board 11. The control circuit board 20 is provided with the connector 21 for electrical connection with outside. The connector 21 enables signal transmission with the battery 136 which is, for example, a lithium battery module mounted on a vehicle. Signals indicating a battery status or a charging status of the lithium battery are sent from the lithium battery module. The interboard connector 23 is provided for signal transference with the control circuit 172 mounted on the control circuit board 20. Switch timing signal for the inverter circuit is transmitted from the control circuit board 20 to the gate drive circuit board 22 through the signal line 176 and the interboard connector 23. Gate drive signal is generated at the gate drive circuit board 22 and applied on each of the gate electrodes of the power module.

The openings are formed at an upper part and a lower part of the chassis 12. These openings are covered with the upper cover 10 and the lower cover 16 fixed to the chassis 12, for example, with screws. The coolant passage 19 is provided in the center of the chassis 12. The power module 300 and the cover 420 are fixed to the coolant passage 19. The coolant passage 19 is thus formed and tested for water leak. After passing the water leak test, boards and the capacitor module 500 are fixed through the upper and lower openings of the chassis 12. The configuration with the coolant passage 19 provided in the center and the upper and lower openings of the chassis 12 through which necessary parts are installed and fixed leads to better productivity. The water leak test after the completion of the coolant passage 19 realizes higher productivity and reliability.

FIGS. 5A to 5C show an aluminum cast of the chassis 12 which includes the coolant passage 19. FIG. 5A is a perspective view of chassis 12. FIG. 5B is a top view of the chassis 12 seen from an arrow B in FIG. 5A. FIG. 5C is a bottom view of the chassis 12 seen from an arrow C in FIG. 5A. As shown in FIG. 5A, the chassis 12 and the coolant passage 19 formed in the chassis 12 are integrally casted. The upper surface or the lower surface of the chassis 12 is substantially rectangular. An inlet 401 for taking in the coolant is provided on one of the short sides of the chassis. An outlet 403 for coolant is provided on the same side.

Figure 13:
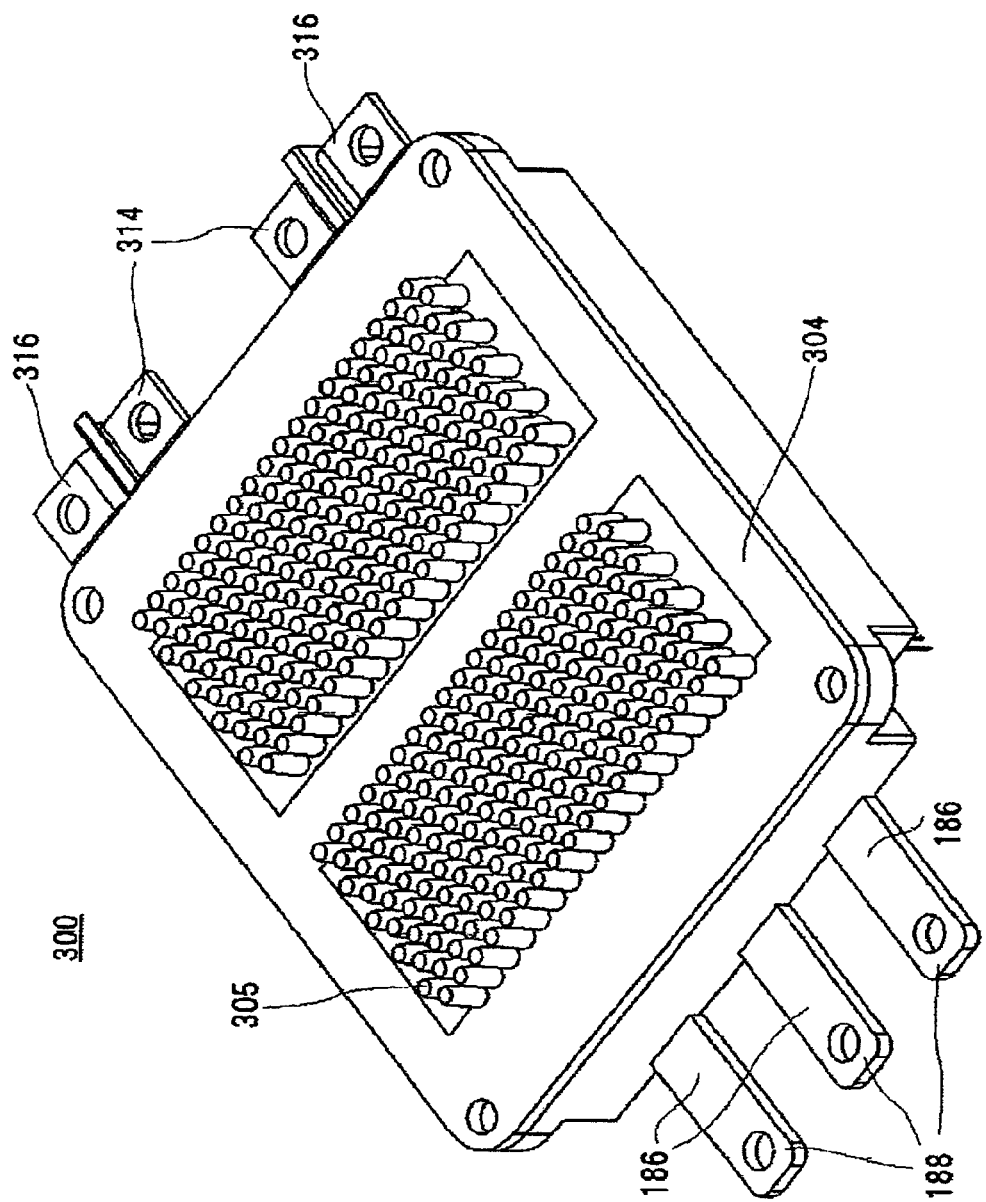
FIG. 13 is a bottom perspective view of the power module which relates to the present embodiment.

After flowing into the coolant passage 19 through the inlet 401, the coolant flows along one of the long side of the rectangle as shown by an arrow 418, turns at just before the other one of the short sides of the rectangle as shown by an arrow 421, flows along the other of the long sides of the rectangle as shown by an arrow 422, and flows out from the outlet 403. One pair of the openings 400 and 402 is provided in each direction of the coolant passage 19. The power modules 300, shown below in FIG. 13, are fixed to each of the openings. The cooling fin 305 for cooling each of the power modules 300 protrudes into the flow of the coolant through each of the openings. The power modules 300 are fixed in parallel along the flow, that is, the long side of the chassis 12. A support part 410 is thus integrally formed with the chassis so that each of the power modules 300 may fully cover the openings of the coolant passage 19. The support part 410 is formed in a substantial center of the chassis 12. One of the power modules 300 is fixed to the support part 410 on the side where the inlet and outlet of the coolant exist, while the other power module 300 is fixed to the support part 410 on the other side where the coolant turns. Threaded holes 412 shown in FIG. 5B are used for fixing the power module 300 on the inlet and outlet side to the coolant passage 19. The opening 400 is thus sealed. Threaded holes 414 are used for fixing the power module 300 on the other side to the coolant passage 19. The opening 402 is thus sealed.

The power module 300 on the inlet and outlet side is to be cooled by both cold coolant from the inlet 401 and warmed coolant which flows near the outlet. On the other hand, the power module 300 on the other side is to be cooled by coolant with more moderate temperatures. As a result, the configuration of the coolant passage and the two power modules 300 has an advantage in balanced cooling efficiency of the two power modules 300.

The support part 410 is necessary for fixing the power modules 300, sealing the openings 400 and 402, and strengthening the chassis 12. A partition wall 408 is provided for separation of the back and forth flow of coolant in the coolant passage 19. The partition wall 408 is integrally formed together with the support part 410 and also strengthens the chassis 12. The partition wall 408 transfers the heat between the back and forth passages, and equalizes the coolant temperature flowing through them. Large difference between the back and forth coolant temperature diminishes the cooling efficiency. Since the partition wall 408 is integrally formed together with the support part 410, the difference in the coolant temperature is reduced.

FIG. 5C shows the reverse side of the coolant passage 19. The openings 404 are formed on the reverse side at an area corresponding to the position where the support part 410 exists. The openings 404 improve yield of the integral structure of the support part 410 with the chassis 12. The openings 404 remove double structure of the support part 410 and the bottom of the coolant passage 19, make the casting easier, and improve productivity.

The through-hole 406 is formed between the side of the coolant passage 19 and the long side of the rectangle chassis to pass through upper and lower sides of the passage. Electrical components on the both sides of the coolant passage are electrically connected to each other through the through-hole 406.

The chassis structure shown in FIGS. 5A to 5C is suitable for casting, particularly aluminum die casting, because of the integral structure of the coolant passage 19 with the chassis 12. Since the part where the coolant turns shown by the arrow 421 is a part of the opening 402, integral casting of the turn part of the passage is made possible. By fixing the power module 300 to the opening 402, a bent passage is realized. Moreover, miniaturization is realized by utilizing the turn part of the passage for cooling. Inner walls defining the coolant passage 19 and the sides of the partition wall 408 are substantially vertical to the surface at which the openings are formed. This configuration enables the passage to be formed by the power modules 300 fixed to the openings 400 and 402 on the front surface and the cover 420 fixed to the bottom surface. At this point of the production, the water leak of the passage is inspected before the components are mounted. This results in removal of defectives in early stage of the production and improvement of the productivity.

The power modules 300 are fixed on the upper openings 400 and 402 and the cover 420 is fixed on the lower openings 404 of the coolant passage 19, as shown in FIG. 6. The AC electric power lines 186 and the AC connectors 188 protrude from the chassis 12 on one of the long sides of the rectangle of the chassis 12. The cross-sectional view in FIG. 7 shows the AC terminal case 17 mounted on the AC connector 188 side of the power inverter 200 for connecting the AC terminals of the motor generator 192 and 194 with the AC connectors 188.

FIG. 6 shows the through-hole 406 formed inside the other long side of the rectangle of the chassis 12 and the DC positive terminals 314 and the DC negative terminals 316 of the power module 300 seen through the through-hole 406. The inverter device 43 for auxiliaries herein shown in dashed line is yet to be mounted. The coolant inlet 13 and the coolant outlet 14 are fixed with screws. After passing the water leak test which can be conducted in this stage of the production shown in FIG. 6, the inverter device 43 for auxiliaries and the capacitor module 500 are mounted.

FIG. 7 is the cross-sectional view of the power inverter 200 with necessary components and wirings. The basic structure is described above with reference to the FIGS. 3 to 6. In FIG. 7, unlike FIGS. 3 to 6, the AC terminal case 17 for connection between the terminal of motor generator 192 and the AC connector 188 is mounted on the AC connector 188 side of the power inverter 200.

As shown in FIG. 7, the two passages of the coolant passage 19 integrally formed with the chassis 12 are provided at a substantial center of the cross-section of the chassis 12 in a vertical direction. The power modules 300 are placed in the opening formed at the upper side of the coolant passage 19. A left passage in FIG. 7 is the forth coolant passage 19 and a right passage is the back coolant passage 19. As described above, each of the back and forth coolant passage 19 is provided with the openings. The openings are covered with the metal boards 304 for cooling the power modules 300. The cooling fins 305 provided on the metal boards 304 protrude through the openings into the flow of the coolant. The inverter device 43 for auxiliaries is fixed on the lower side of the coolant passage 19.

As shown on the left side of FIG. 7, the AC electric power line 186 with cross-section in rectangular parallelepiped shape, or busbar shape, leading out of inside the power module 300, forms the AC connector 188. On the right side of FIG. 7, the DC positive and negative terminals 314 and 316 with cross-section in rectangular parallelepiped shape, or busbar shape are provided respectively. The through-hole 406 is formed on the right side of the coolant passage 19 in the chassis 12. The DC positive and negative terminals 314 and 316 are directly, electrically, and mechanically connected to the positive and negative terminals of the capacitor leading out of the capacitor module 500. The coolant passage 19 is formed in the substantial center of the chassis 12 with back and forth passages along the long side of the rectangle. Since the AC connector 188 and the DC positive and negative terminals 314 and 316 are placed substantially vertical to the flow of the coolant, electric wiring is orderly configured, resulting in miniaturization of the power inverter 200. The DC positive and negative busbars 315 and 317 and the AC electric power line 186 of the power module 300 protrude from the power module 300 and make up the connecting terminal. This results in a simple structure. Since other connection conductor is not used, miniaturization is realized. This structure improves both productivity and reliability. The through-hole 406 through which the DC positive and negative terminals 314 and 316 of the power module 300 and negative and positive terminals 504 and 506 of the capacitor module 500 connect with each other is separated from the coolant passage 19 by a frame in the chassis 12. This configuration improves reliability.

The aluminum lower cover 16 with high heat conduction is provided for the lower openings of the chassis 12. A metal capacitor case 502 for the capacitor module 500 is fixed to the lower cover 16. The lower cover 16 is cooled by the coolant flowing through the coolant passage 19 through the chassis 12. Heat generated inside the capacitor module 500 is cooled through the lower cover 16.

The power modules 300 with high heating value are fixed on one of the sides of the coolant passage 19. The fins 305 of the power modules 300 protrude into the passage through the openings of the coolant passage 19 for more efficient cooling. The inverter device 43 for auxiliaries with next higher heat radiation is cooled on the other side of the coolant passage 19. The capacitor module 500 with next higher heating value is cooled through the chassis 12 and the lower cover 16. With the cooling structure in accordance with the heat radiation value, cooling efficiency and reliability are improved, at the same time, the power inverter 200 is miniaturized more.

Since the inverter device 43 for auxiliaries is fixed on the side of the coolant passage 19 facing the capacitor module 500 of, the capacitor module 500 is used as a smoothing capacitor for the inverter device 43 for auxiliaries. This configuration shortens the wiring, resulting in reducing inductance.

The gate drive circuit board 22 which holds the gate drive circuit 174 shown in FIG. 2 is placed above the power modules 300. The control circuit board 20 on which the connector 21 is mounted is placed above the gate drive circuit board 22 through the metal board 11, which releases heat and acts as electromagnetic shield. The control circuit board 20 is provided with the control circuit 172 shown in FIG. 2. By fixing the upper cover 10 to the chassis 12, the power inverter 200 in accordance with the present embodiment is assembled.

Since the gate drive circuit board 22 is placed between the control circuit board 20 and the power module 300, instructions for operation timing of the inverter circuit are sent from the control circuit board 20 to the gate drive circuit board 22; gate signals are generated in the gate drive circuit board 22 in response and applied on each gate of the power modules 300. Configuration of the control circuit board and the gate drive circuit board 22 according to the electrical connection makes the electrical wiring simple and the power inverter 200 small.

Figure 8:
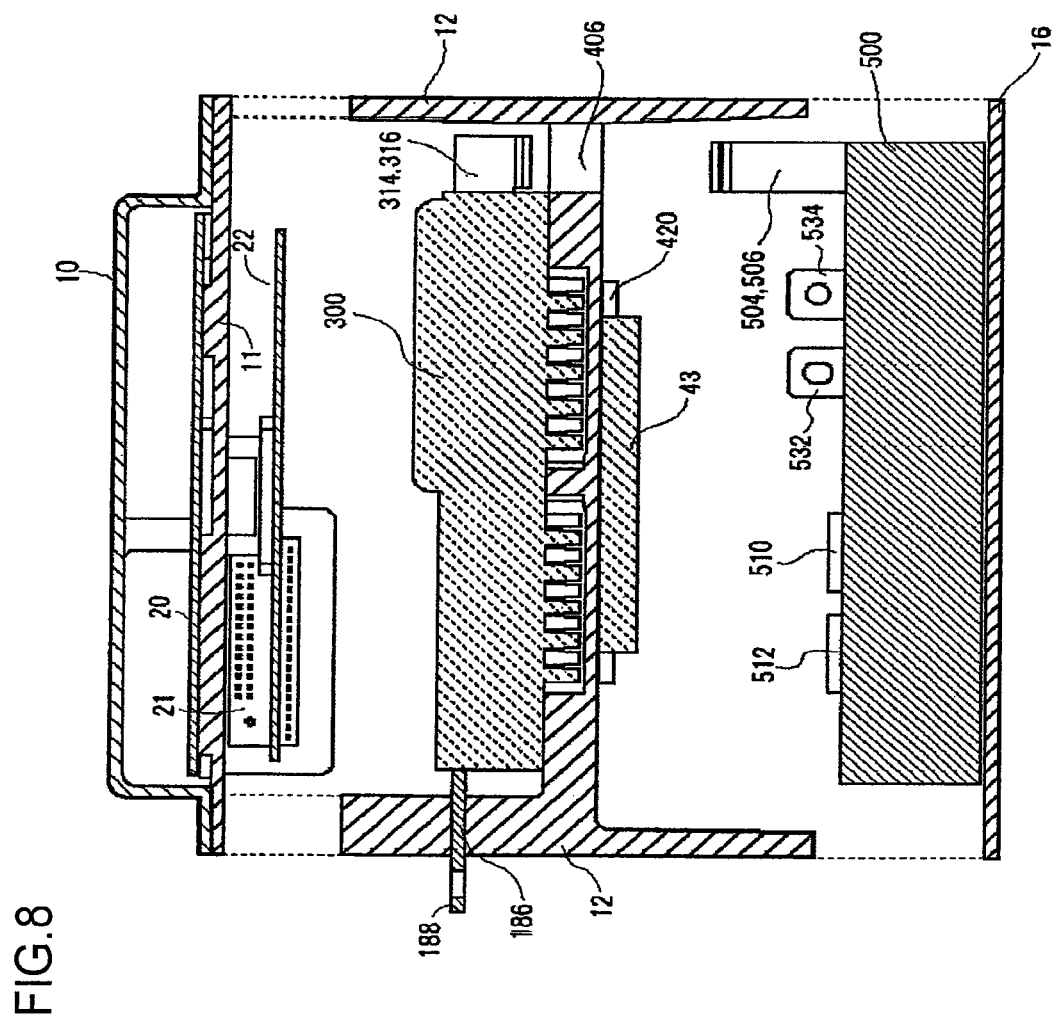
FIG. 8 is a cross-sectional view of an essential part of the power inverter shown in FIG. 7.

FIG. 8 shows the cooling mechanism. Fixing the power modules 300 on one of the sides of the coolant passage 19 and the inverter device 43 for auxiliaries on the other side enables both the power modules 300 and the inverter device 43 for auxiliaries to be cooled at the same time by the coolant passage 19. Better cooling effect is realized because the cooling fins of the power modules 300 contact with the coolant flowing in the coolant passage 19. The coolant passage 19 cooles the chassis 12 on which the lower cover 16 and the metal board 11 are fixed. The metal case of the capacitor module 500 is fixed on the lower cover 16. The capacitor module 500 is thus cooled through the lower cover 16 and the chassis 12. Likewise, the control circuit board 20 and the gate drive circuit board 22 are cooled through the metal board 11. Configuration with the coolant passage 19 at the center, the metal board 11 on one side, and the lower cover 16 on the other side realizes efficient cooling of the components for the power inverter 200 in accordance with the heating value. The components are orderly placed in the power inverter 200, resulting in miniaturization.

The coolant passage 19 with the power modules 300 mounted is tested for water leak. After passing the test, necessary components are fixed through the upper and lower openings of the chassis 12. This improves productivity.

Features of the power inverter 200 in accordance with the embodiment of the present invention will be further described. In the overall laminated structure and cooling structure of the power inverter in accordance with the present embodiment, the power modules 300, which are major heating elements, are directly cooled by the coolant flowing in the coolant passage 19. The coolant passage 19 is sandwiched between the capacitor module 500, which is another heating element, and the power modules 300. This sandwiched laminated structure realizes thinness and smallness.

Cooling elements for the power inverter 200 primarily include the coolant passage 19. Other cooling elements include the metal board 11, which functions as the electromagnetic shield. The metal board 11 transfers the heat from the control circuit board 20 and the gate drive circuit board 22 to the chassis 12, and is cooled by the coolant of the coolant passage 19. The lower cover 16, made of highly heat-conductive material, also transfers the heat from the capacitor module 500 to the chassis 12, and is cooled by the coolant of the coolant passage 19. On the side of the lower cover 16 of the coolant passage 19 exists, the inverter device 43 for auxiliaries with relatively small capacity may be placed for the on-vehicle air conditioner, the oil pump, and other pumps. The heat from the inverter device 43 for auxiliaries is cooled by the coolant of the coolant passage 19 through the frame in the chassis 12.

In the power inverter in accordance with the present embodiment, the cooling element has the three-layer laminated structure: the metal board 11, the coolant passage 19 of a cooling section 9, and the lower cover 16. These cooling elements are hierarchically placed adjacent to each heating element (the power modules 300, the circuit boards 20 and 22, and the capacitor module 500). The coolant passage 19, which is a major cooling element, exists in the center of the hierarchical structure. The metal board 11 and the lower cover 16 transfer the heat to the coolant of the coolant passage 19 through the chassis 12. The three cooling elements (the coolant passage 19, the metal board 11, and the lower cover 16) are contained in the chassis 12 and improve in cooling performance, reducing thickness, and miniaturization.

Figure 9:
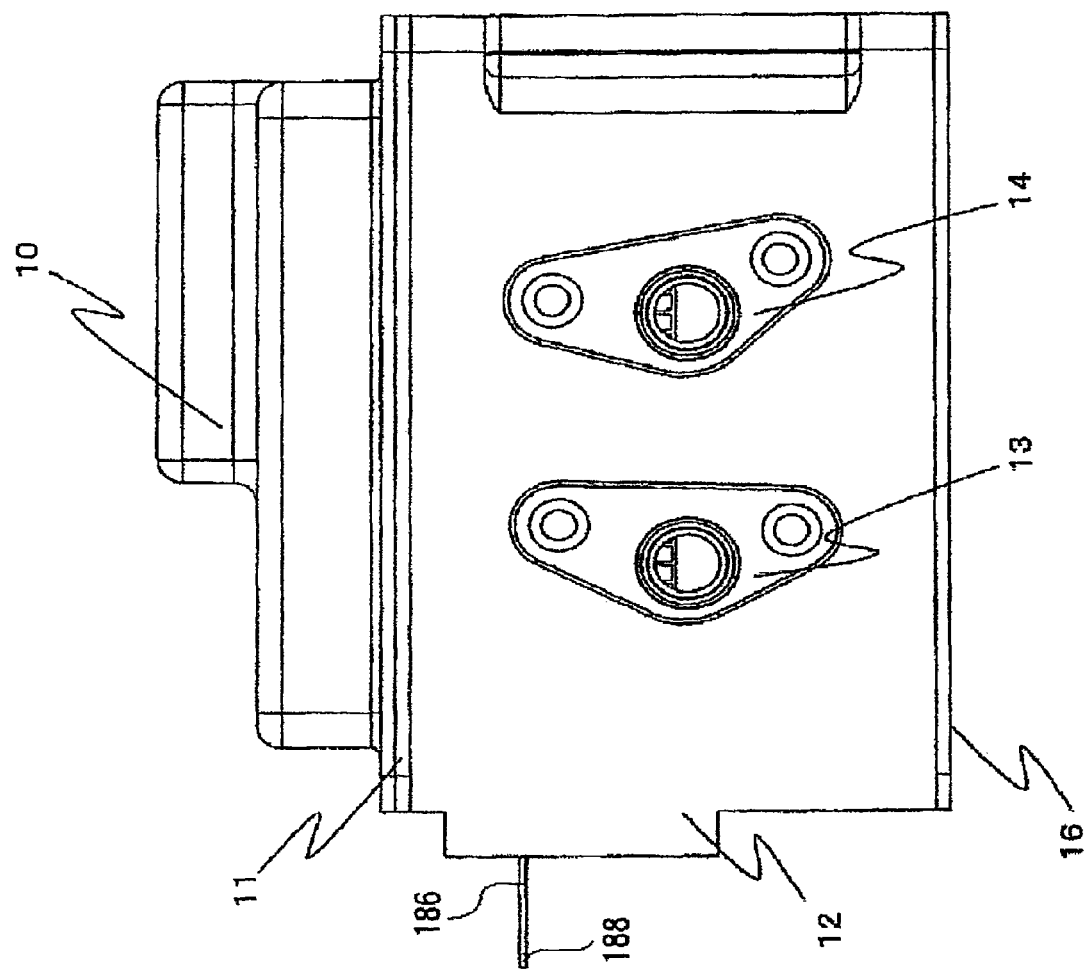
FIG. 9 is a left side view of the power inverter shown in FIG. 3.
Figure 10:
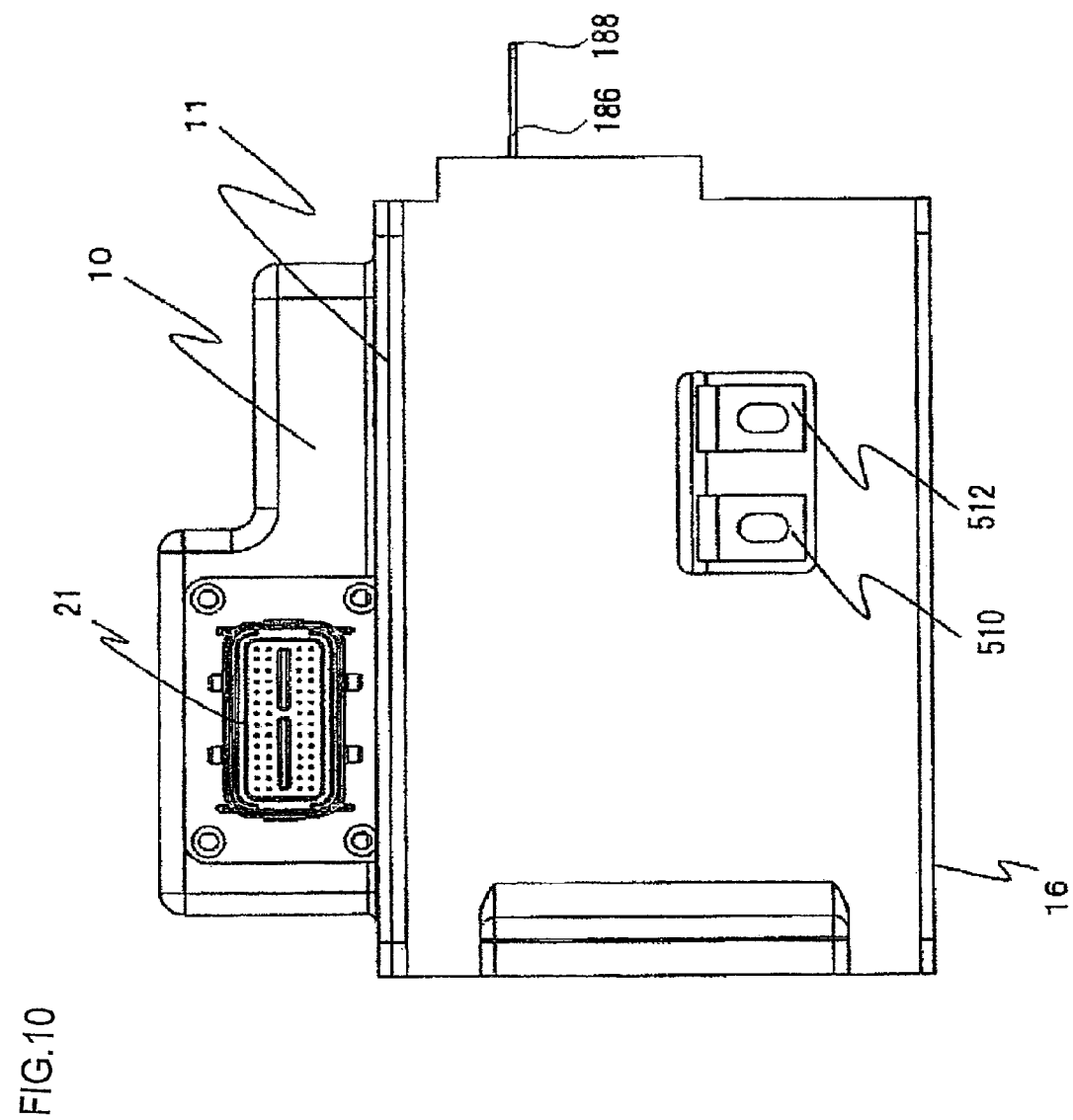
FIG. 10 is a right side view of the power inverter shown in FIG. 3.
Figure 11:
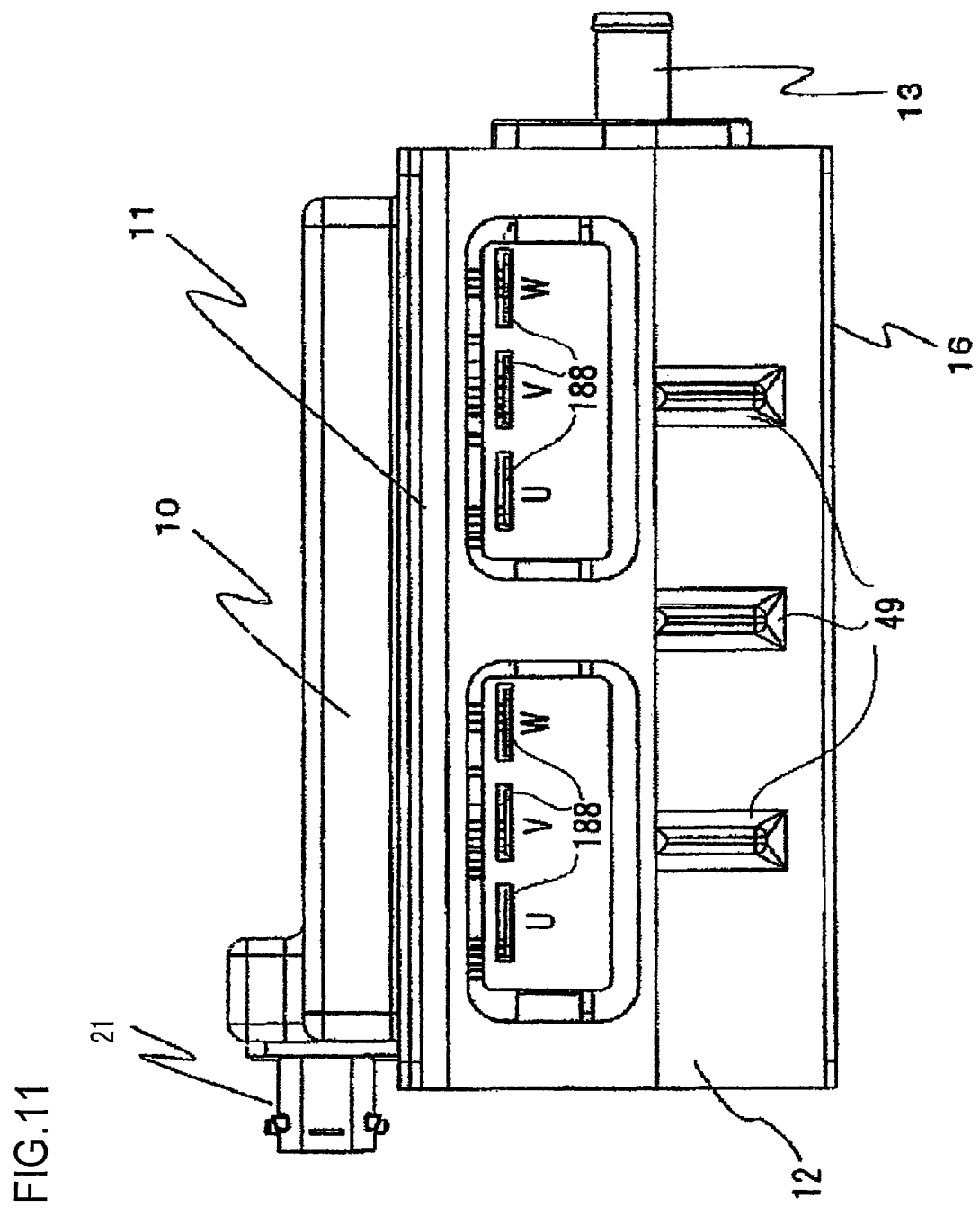
FIG. 11 is a rear view of the power inverter shown in FIG. 3.

The external structure of each side of the power inverter in accordance with the present embodiment will be hereinafter described with reference to FIGS. 9 to 11. FIG. 9 is the left side view of the power inverter shown in FIG. 3 in accordance with the present embodiment. FIG. 10 is the right side view of the power inverter shown in FIG. 3 in accordance with the present embodiment. FIG. 11 is the rear view of the power inverter shown in FIG. 3 in accordance with the present embodiment.

As shown in FIG. 9, the inlet 13 and the outlet 14 of the coolant are juxtaposed to each other in the center of the chassis 12 in a vertical direction. The power modules 300 are cooled through the metal board 304 by circulation of the coolant through the inlet 13 and the outlet 14. The metal board 11 for the electromagnetic shield is placed at the top of the chassis 12. The upper cover 10 is fixed on the metal board 11, while the lower cover 16 is fixed on the bottom of the chassis 12. The power inverter in accordance with the present embodiment is thus integrally structured. Highly heat-conductive material, for example aluminum, is employed for the chassis 12 so that the cooling effect through the coolant passage is efficiently conducted to the capacitor module 500 via the chassis 12.

Placing the inlet 13 and the outlet 14 juxtaposed to each other on the short side of the rectangular chassis 12 results in lengthening the inside cooling passage and in easier pipework operation when the power inverter 200 is mounted on a vehicle.

FIG. 10 shows the opposite side of the side shown in FIG. 9. The connector 21 of the control circuit board 20 shown in FIG. 4 is provided on the upper cover 10. The connector 21 is a connecting terminal for the control unit 170 shown in FIG. 2 to transfer signals with outside. The chassis 12 is provided with the DC positive connecting terminal 510 and the DC negative connecting terminal 512 to be connected to the battery. These connecting terminals 510 and 512 correspond to the DC connector 138 shown in FIG. 2. The AC electric power line 186 protrudes from the chassis 12 and makes up the AC connector 188 at the end of the line 186.

Since the connecting terminals to the battery and the connector 21 for signal line are provided on the opposite side of the side where the inlet 13 and the outlet 14 of the coolant are provided, reliability is improved. Also, workability for mounting the power inverter 200 on a vehicle is improved.

FIG. 11 is the rear view of the power inverter shown in FIG. 3, showing the AC connectors 188, which make up AC connecting terminals to the motor, provided on the rear surface. The connector 21 from the control circuit board 20 and the coolant inlet 13 protrude left and right, respectively in FIG. 11. The casting slots 49 for casting the chassis material are formed on the chassis 12. FIG. 11 shows an example of juxtaposed two power modules (semiconductor modules) 300 provided with the AC electric power line 186 of U-phase, V-phase, and W-phase, including three of the upper and lower arms series circuits shown in FIG. 2.

As seen from the FIG. 11, supply and discharge of the coolant, transfer of DC electric power, and transfer of AC electric power are operated on different side of the chassis respectively. This contributes to improvement in workability and reliability.

Figure 12:
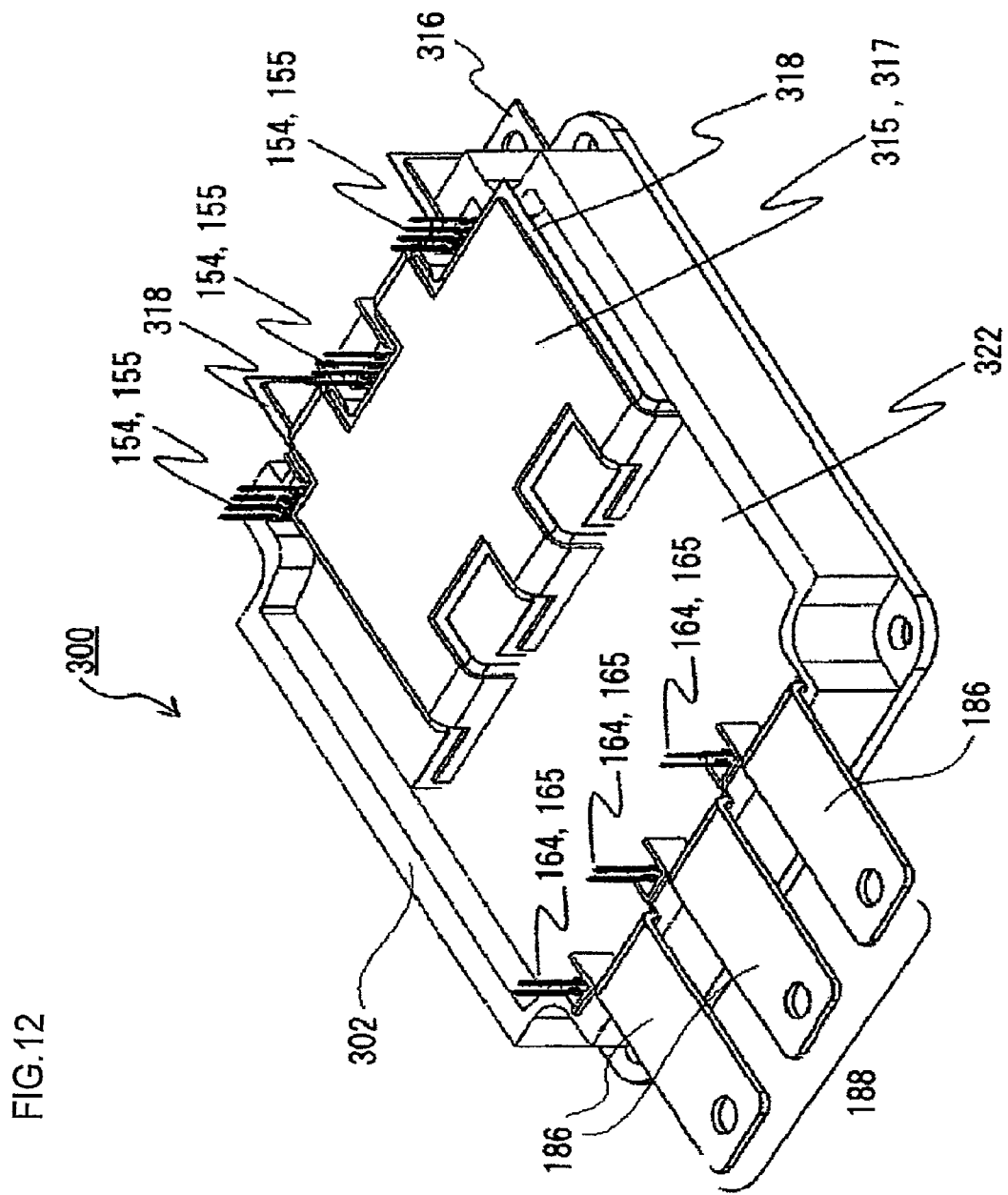
FIG. 12 is a top perspective view of the power module which relates to the present embodiment.
Figure 14:
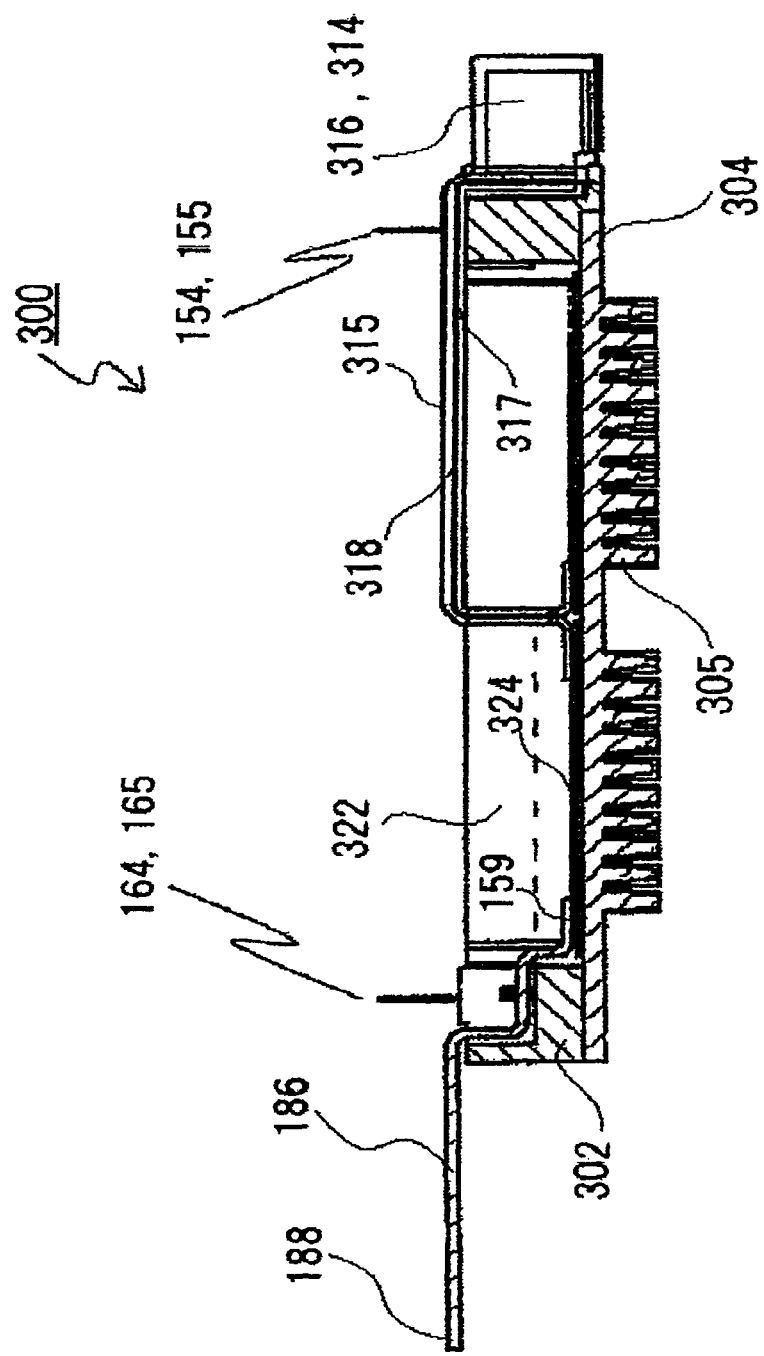
FIG. 14 is a cross-sectional view of the power module which relates to the present embodiment.
Figure 21:
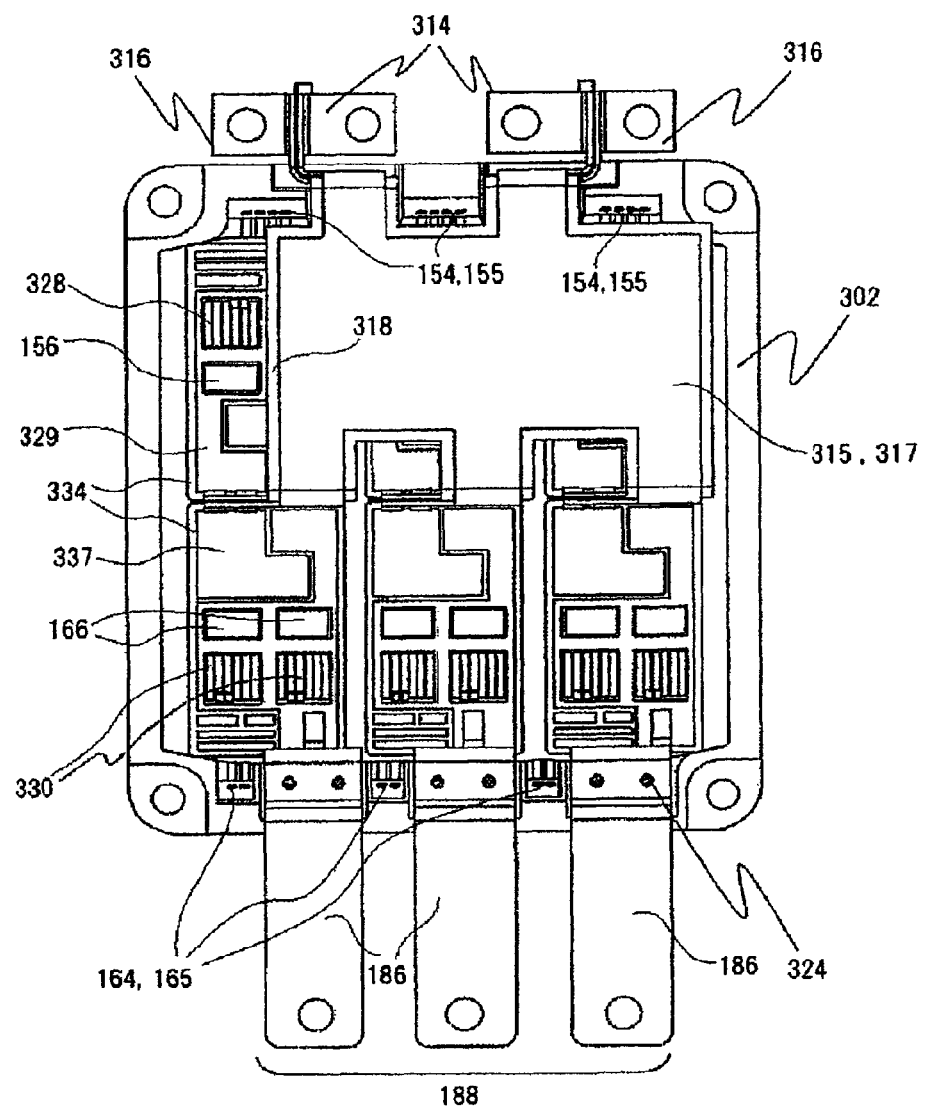
FIG. 21 is a top view that shows the configuration of the power module which relates to the present embodiment.

The power modules 300 of the power inverter in accordance with the present embodiment will be hereinafter detailed with reference to FIGS. 12 to 14 and 21. FIGS. 12-14, and 21 show only one of the power modules 300 to facilitate explanation. FIG. 12 is the top perspective view of the power module 300 which relates to the present embodiment. FIG. 13 is the bottom perspective view of the power module 300 which relates to the present embodiment. FIG. 14 is the cross-sectional view of the power module which relates to the present embodiment. FIG. 21 is the plain view of the power module which relates to the present embodiment.

In FIGS. 12 to 14 and 21, components are numbered as follows: power module (semiconductor module) 300; power module case 302; metal board 304; cooling fin 305; AC electric power line with substantially rectangular cross-section 186; DC positive terminal 314; DC negative terminal 316; thin insulation member 318; IGBT control terminal 154/155 for the upper arm of the power module 300; IGBT control terminal 164/165 for the lower arm of the power module 300; resin or silicone gel for chip protection 322; pin 324 for holding the AC electric power line which acts as AC busbar; IGBT for the upper arm 328; IGBT for the lower arm 330; diode 156/166; insulation substrate board 334; and, conductor 337, respectively.

The power module 300 is roughly provided with the semiconductor module including wiring in the power module case 302 made of resin material, for example; the metal board 304 made of metallic material such as Cu, Al, or AlSiC; and, connecting terminals with outside. The power module 300 is provided with connecting terminals with outside such as the AC connector 188 of U-phase, V-phase, and W-phase for connecting to the motor, the DC positive terminals 314 and the DC negative terminals 316 to be connected to the capacitor module 500. The semiconductor module is provided with the IGBTs 328 and 330 of the upper and lower arms on the insulation substrate board 334 and the diodes 156 and 166, and is protected by resin or silicone gel 322. The insulation substrate board 334 may be either a ceramic substrate or a thinner insulation sheet. The metal board 304 is provided with the fin 305 on the back side of the insulation substrate board 334 to be immersed into the coolant in the coolant passage for efficient cooling.

The DC terminals 314 and 316, which connect with the capacitor module 500, are soldered or ultrasonically-bonded at points to be connected (refer to FIG. 14) in the center of the board 334 according to FIG. 21. The DC terminals 314 and 316 provided with the thin insulation member 318 lying between the terminals 314 and 316 for insulation, are brought to the right edge of the power module 300 with the DC terminal 314 over the insulation member 318 and the DC terminal 316. Both the DC terminals 314 and 316, which are busbars, and the insulation member 318 are then twisted. Lastly, as shown in FIG. 21, the terminals that connect to the terminals of the capacitor are aligned.

As shown in FIGS. 12 to 14 and 21, one side of the metal board 304 is provided with the resin power module case 302 with the built-in IGBTs and diodes that constitute the inverter circuit. The fin 305 is brazed on the other side of the metal board 304 as shown in FIG. 13. The insulation substrate board 334 fixed on the one side of the metal board 304 as shown in FIGS. 14 and 21. The thin conductors 337 are attached to the insulation substrate board 334; and chips of the upper arm IGBTs 328, the upper arm diodes 156, the lower arm IGBTs 330, and the lower arm diodes 166 are fixed on the conductors 337, for example, with solder. The chips of the upper arm are fixed on the metal board 304 side of the laminated busbars 315 and 317, in other words, on the DC terminals side as in FIG. 14. The chips of the lower arm are fixed on the AC connector 188 side of the laminated busbars 315 and 317. DC electricity is thus supplied from the substantial center for reducing inductance as hereinafter described.

The fin 305 is brazed at positions corresponding to the chips of the both upper and lower arms across the metal board 304 (FIGS. 13 and 14). The fin 305 protrudes into the coolant passage 19 through the openings of the passage. Metal surface around the fin 305 of the metal board 304 is used for covering the openings provided over the coolant passage 19.

As shown in FIG. 14, the AC electric power line 186 is connected to the AC terminals 159 (refer to FIG. 2) which are connection points of the upper and lower arms, protrudes from the power module 300, and makes up the AC connector 188 at the end of the line 186. FIGS. 12 and 13 show the AC electric power lines 186 corresponding to U-phase, V-phase, and W-phase that protrude from the power module case 302 and make up the AC connector 188.

The AC electric power line 186 fixed to the power module 300 is described with reference to FIG. 14. The AC electric power line 186 with substantially rectangular parallelepiped cross-section is fixed to an appropriate part of the insulation substrate board 334 at the right end (FIG. 14) of the line 186 with, for example, solder, and is connected to the connecting terminals (not figured herein) from the motor generator 192 at the AC connector 188, which is the left end of the line 186. The left end side of the AC electric power line 186 is sensitive to the vibration of in-vehicle motor. The AC electric power line 186 is the rigid conductor with substantially rectangular parallelepiped cross-section so as to transfer a high current. The vibration of the motor transmitted to connecting parts of the insulation substrate board 334 via the AC electric power lines 186 may lead to loose connection of the connecting parts. In the present embodiment, therefore, as shown in FIG. 21, the pins 324 are used for holding the AC electric power lines 186 between the connecting parts and the AC connector 188, so that the vibration of the motor may not be transmitted directly to the connecting parts of the insulation substrate board 334.

The pins 324 are integrally or semi-integrally formed with the power module case 302. The AC electric power line 186 is positioned by inserting the pins 324 for positioning. Otherwise, the pins 324 may be inserted into holes of the power module case 302 for positioning with the pins 324 and the AC electric power lines 186 (bent busbar) integrally or semi-integrally structured. In other words, as long as the pins 324 absorb stress such as the vibration of the motor, without leaving any outside stress to the connecting parts between the AC electric power lines 186 and the insulation substrate board 334, the means is not limited to pins. FIG. 21 shows an example with the two pins provided for each phase of the AC electric power line 186. Pins may be cylindrical or cross-shaped.

As seen from FIGS. 6 and 11, the AC electric power lines 186 protrude from the chassis 12 and are flexibly connectable to the connecting terminals of the motor. Thus, intermediate members for connection between the AC connector 188 and the AC output terminals of the power module 300 are not necessary. Since the AC electric power lines 186 protrude from the chassis, it is easier to connect with the connecting terminals of the motor with smaller number of components and connections. This configuration improves workability and reliability, compared to conventional configuration where the terminals of the AC electric power lines 186 are fixed to and contained in the case of the power module 300. Thus, a synergistic effect, the removal of the effect of outside stress or vibration on the insulation substrate board 334 and the easy connection with the connecting terminals of the motor, is generated because of the configuration with the protruding AC electric power line 186 and the pins 324.

The insulation substrate board 334 is formed with Cu or Al film on both sides of a ceramic plate. FIG. 14 shows an example with the insulation substrate board 334 on which the metal board 304 (Cu, Al, or AlSiC) with fins or pins is fixed on the underside of the board 334. The IGBTs 328 and 330 and the diodes 156 and 166 are soldered on the topside of the board 334, and the DC terminals 314 and 316 ultrasonically-bonded both on the topside of the board 334. The control terminals 154, 155, 164, and 165 of the power module illustrated in FIG. 21 are the gate electrodes terminals 154 and 164 and the emitter terminals 155 and 165 of the upper and lower arms shown in FIG. 2. Signal for controlling the switching operation of the IGBTs are applied to these terminals.

Further description for the configuration of the upper and lower arms series circuits in the power module 300 (FIG. 21) is given below. As seen from the cross-sectional view of the power module 300, the insulation substrate board 334 made of ceramic with Cu film on both sides is soldered on the metal board 304 provided with the fin 305 (FIG. 14). The metal board 304 itself and the fin 305 have high heat conductivity and heat release function. Heating elements such as the diodes 156 and 166 and the IGBTs 328 and 330 are soldered on the upper Cu film of the metal board 304.

Figure 20C:
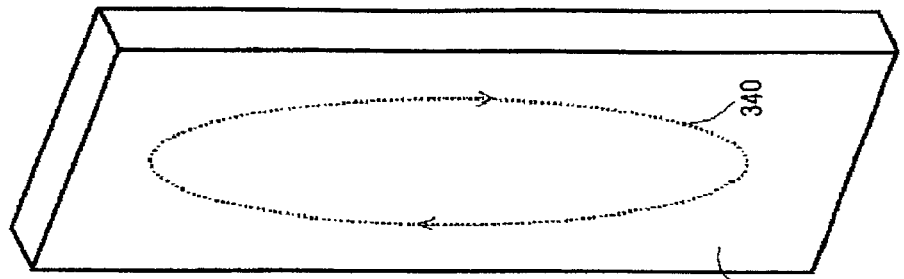
FIGS. 20A to 20C show schematic diagrams of an actual configuration of the series circuit of the upper and lower arms and its functions or effects on an insulation substrate board mounted on metal board on the power module which relates to the present embodiment.
Figure 20B:
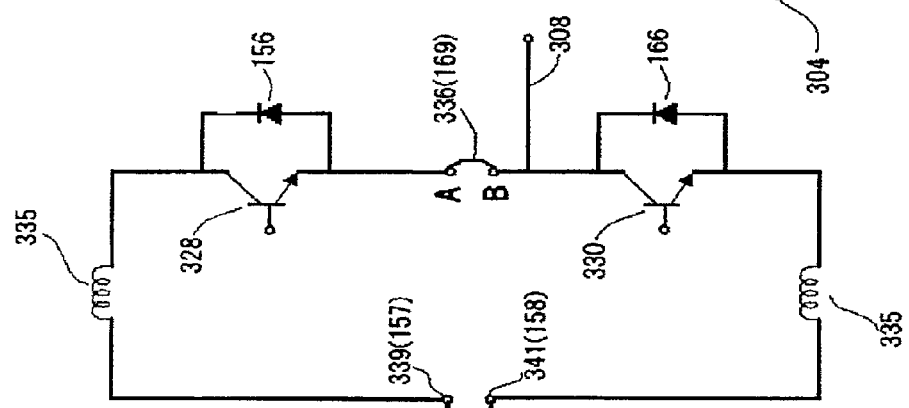
Figure 20A:
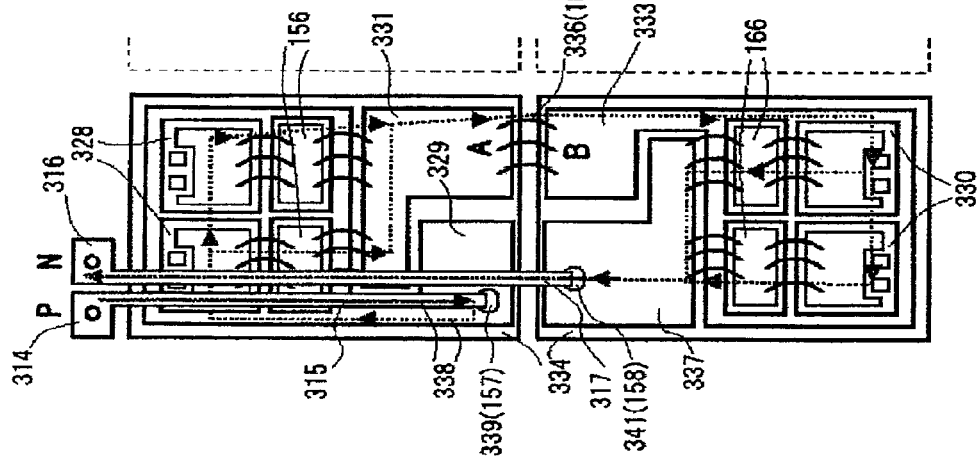

FIGS. 20A to 20C show the schematic diagrams of the actual configuration of the upper and lower arms series circuit and its functions and effects on the ceramic insulation substrate board 334 mounted on the metal board 304. Inductance of the power module is reduced as described below. The DC positive terminal 314, which makes up the connecting terminal of the power module 300, is integrally formed with the positive busbar 315, extends over the upper arm, and solders a junction 339 for connecting with a conductor 329. Likewise, the DC negative terminal 316 is integrally formed with the negative busbar 317, extends over the upper arm, and solders a junction 341 for connecting with a conductor 337 as shown in FIG. 20A.

In accordance with the present embodiment, the junctions 339 and 341 are disposed close to each other in the substantial center and left of the insulation substrate board 334 (refer to FIG. 20A). The DC terminals 314 and 316 and the junctions 339 and 341 are connected by the positive busbar 315 and the negative busbar 317 respectively, which are laminated with the thin insulation 318. Current directions of the positive busbar 315 and the negative busbar 317 are opposite to each other (refer to arrows of current flow 338). The IGBTs 328 and 330 and the diodes 156 and 166 (FIG. 20) are connected in parallel respectively to form two arms, and increase electric current flowing through the upper and lower arms. By arranging the junctions 339 and 341 adjacent to each other, recovery current that flows through the upper and lower arms is allowed to flow in a circle from the junction 339 to the junction 341. The current flowing in the circle induces eddy current on the metal board 304 and results in reduction in inductance to the recovery current.

Reduction in inductance inside the power module 300 will be detailed below with reference to FIGS. 16 to 21. Relationship between recovery current and spike voltage, heat generation, and effect of reduction in inductance will be described with reference to FIGS. 16 to 20. The above-described inverter circuit 144 (FIG. 2) is provided with the upper and lower arms series circuits 150 corresponding to each of three phases. In normal operations, when either the IGBT 328 of the upper arm or the IGBT 330 of the lower arm of the upper and lower arms series circuit 150 conducts electricity, the other IGBT interrupts electricity. In short, the upper and lower IGBTs do not conduct electricity simultaneously. So, current that short-circuits through the upper and lower IGBTs does not exist. However, current that short-circuits through the upper and lower arms series circuit 150 generates in an inverter circuit which includes the IGBT or the MOSFET. This current is a current arisen from recovery current, and also arisen from the diodes 156 and 166 connected in parallel to the IGBTs. In an inverter circuit including the MOSFETs, diodes equal to the diodes 156 and 166 are provided inside each of the MOSFETs, which ends up in the same phenomena. A circuit that includes the IGBT is described as a representative.

Figure 16A:
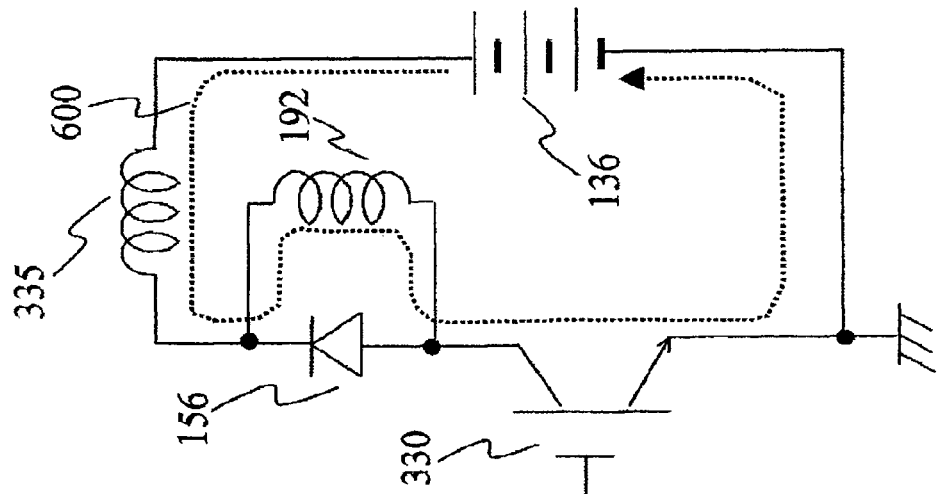
FIGS. 16A to 16C illustrate flow of electric current at turn-on state of an IGBT which relates to the present embodiment.

An example of the recovery current will be described with reference to FIGS. 16A and 17. FIG. 16A shows one IGBT 330 of a plurality of the IGBTs. Connector of the IGBT 330 is connected to the positive terminal of the battery 136 via the reversely-connected diode 156 and the motor generator 192. The emitter of the IGBT 330 for lower arm is connected to the negative terminal of the battery 136. FIG. 16A shows that a return current of the stator of the motor generator 192 flows via the diode 156 with the lower arm IGBT 330 interrupted.

Figure 16B:
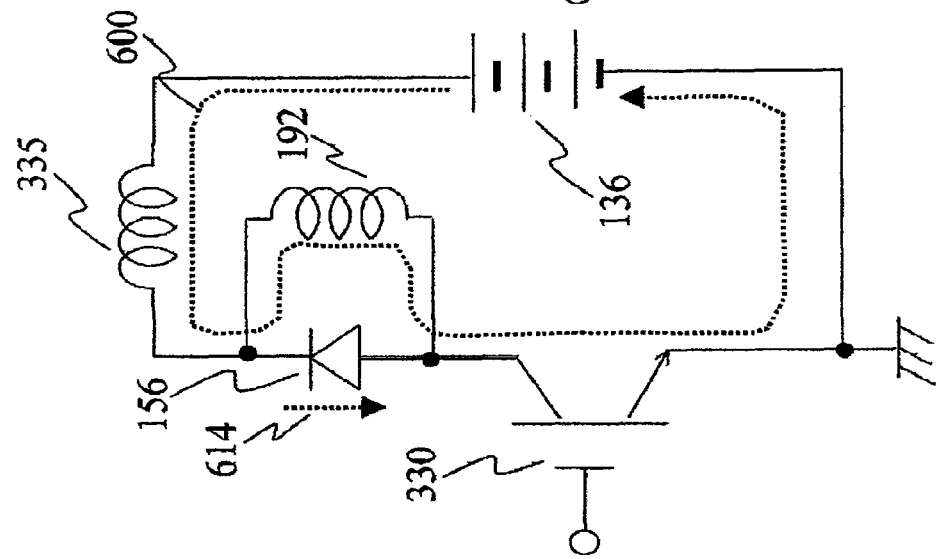
Figure 16C:
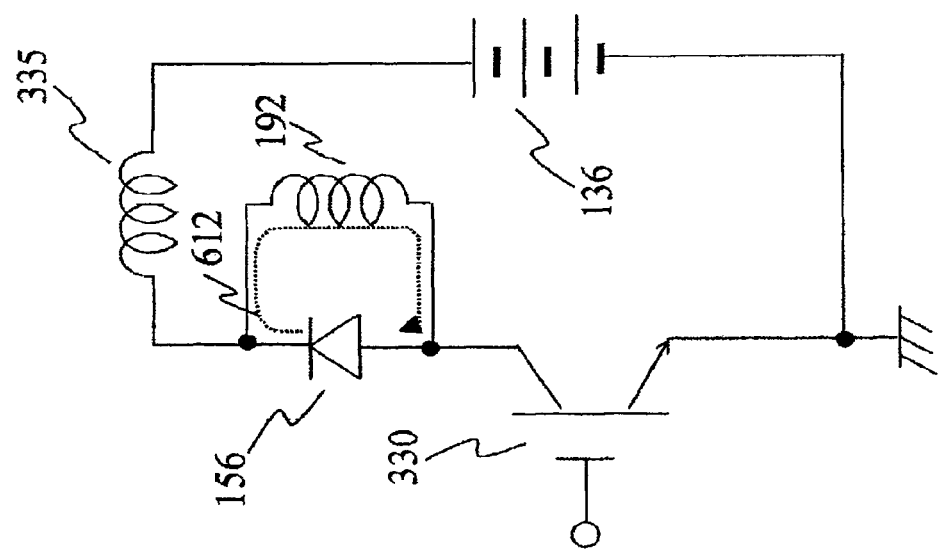

FIG. 16B shows that when the lower arm IGBT 330 conducts electricity, a current flows from the positive terminal of battery 136 to the negative terminal of the battery 136 via a floating inductance 335, the stator of the motor generator 192, and the lower arm of the IGBT 330. The upper arm diode 156 is hereat reverse-biased. Since a recovery current 614 flows, however, collector current of the IGBT flows with the recovery current 614 in addition to a current 600 which flows through the motor generator 192. If stored carrier of the upper arm diode 156 flows as the recovery current 614, the stored carrier disappears; depletion layer is generated in the diode 156; and, the current 614 disappears. The collector current of the lower arm IGBT 330 includes only the current 600 shown in FIG. 16C.

Figure 17:
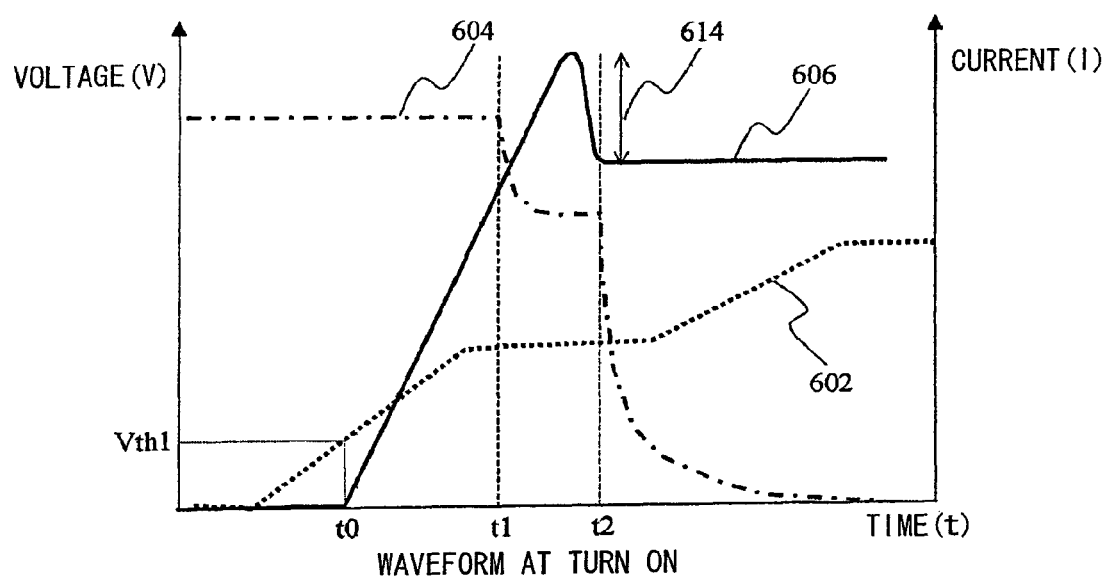
FIG. 17 is a graph that shows waveforms of electric current and voltage at turn-on state of the IGBT which relates to the present embodiment.

FIG. 17 shows a collector current 606 and a collector voltage 604 of the lower arm IGBT 330. Status shown in FIG. 16A corresponds to a leftmost status on a time axis of the graph in FIG. 17. When drive voltage is applied to gate of the IGBT 330, gate current starts flowing. This current recharges capacity both between gate and emitter and between gate and collector. As these get recharged, gate voltage of the lower arm IGBT 330 increases. The return current of the motor generator 192 flows through the upper arm diode 156. The collector current 606 of the lower arm IGBT 330 starts flowing at t0, when the gate voltage 602 exceeds a threshold level Vth1.

At that time, a superimposed current of the recovery current 614 of the diode 156 and the current 600 that flows the motor generator 192 flows through the lower arm IGBT 330 as the collector current 602 of the IGBT 330. The IGBT 330 conducts electricity after t1. The voltage 604 between the collector and the emitter rapidly decreases. Since the current that the recovery current 614 is added to the current 600 that flows through the motor generator 192 flows through the IGBT 330, the collector current 606 has a peak current 614, which is larger than the current 600. On the other hand, when the stored carrier of the diode 156 disappears, the recovery current 614 disappears, and the collector current 606 of the IGBT 330 becomes the current 600 that flows through the motor generator 192.

From t0 to t2, the voltage 604 between the collector and the emitter is high. Therefore, turn-on power loss is generated and extreme heat is generated in the IGBT 330. Voltage is generated by changed current of the collector current 606, which is the sum of the current 600 and the recovery current 614, and the inductance 335. Spike voltage is generated by the inductance 335 of the DC circuit, which flows the upper and lower arms because the recovery current 614, in particular, flows through the upper and lower arms.

The above description is an example of the current that flows through the upper and lower arms. The IGBTs of the upper and lower arms do not simultaneously conduct electricity in a control method or a controlled state of the inverter circuit 144. However, a current that passes the upper and lower arms often flows actually.

Figure 18A:
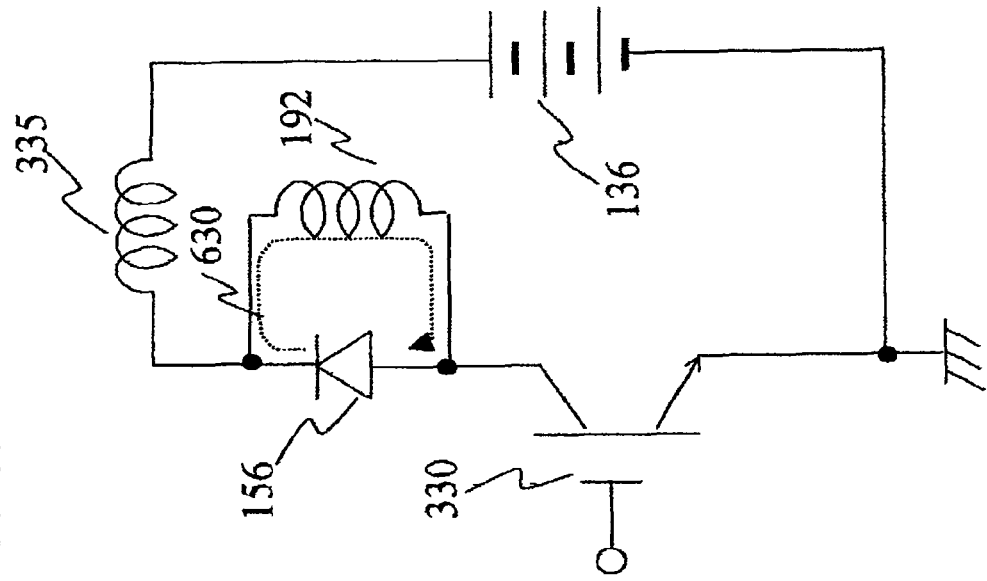
FIGS. 18A and 18B illustrate flow of electric current at turn-off state of the IGBT which relates to the present embodiment.

The interruption operation of the IGBT will be described with reference to FIGS. 18A and 19. The same numbered components are common between FIGS. 16A to 16C, 18A and 18B. In FIG. 18A, the lower arm IGBT 330 conducts electricity. The collector current is flowing through the lower arm IGBT 330 from the battery 136 via the floating inductance 335 and the stator of the motor generator 192. The collector voltage of the lower arm IGBT 330 hereat is low as indicated by dashed-dotted line in FIG. 19. A line 624 shows change in the collector current.

Figure 19:
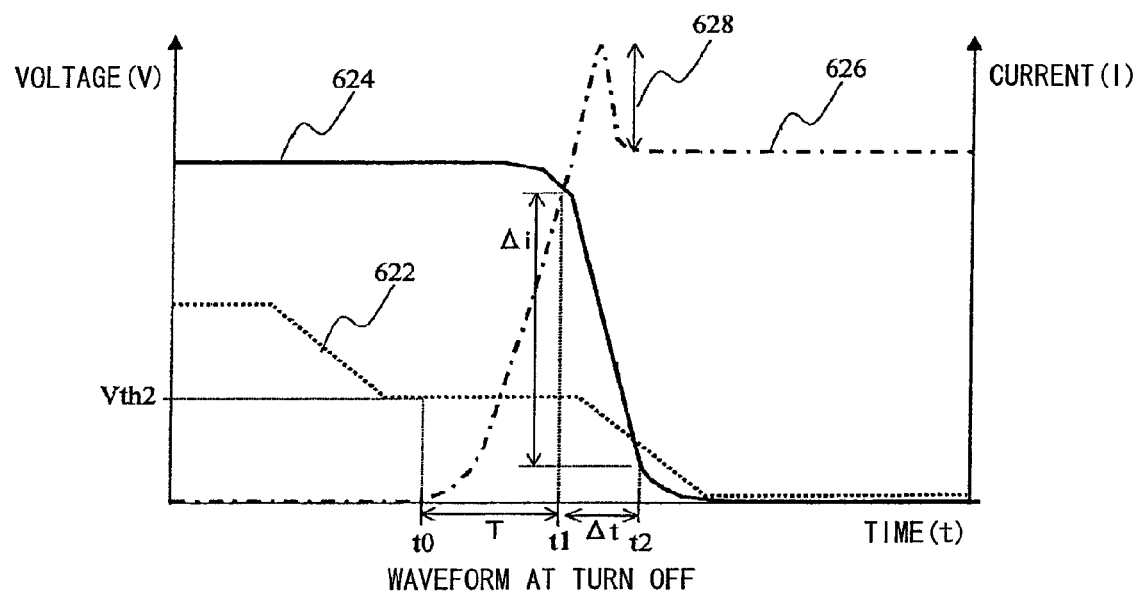
FIG. 19 is a graph that shows waveforms of electric current and voltage at turn-off state of the IGBT which relates to the present embodiment.

When a gate voltage 622 of the power module 300 is reduced to below the threshold level Vth2, the collector current 624 starts to decrease, and a voltage 626 indicated by the dashed-dotted line and applied to the collector increases (FIG. 19). When the collector current of the lower arm IGBT 330 starts reducing, spike voltage (L×di/dt) is generated because of a reduction rate di/dt and the inductance element 335 in the DC circuit. And, a resultant vector of the collector voltage of the lower arm IGBT 330 and the spike voltage becomes a voltage generated in DC circuit, for example, between the DC positive terminal 314 and the DC negative terminal 316. The collector voltage becomes high because of the spike voltage applied between the collector and the emitter of the IGBT 330.

Figure 18B:
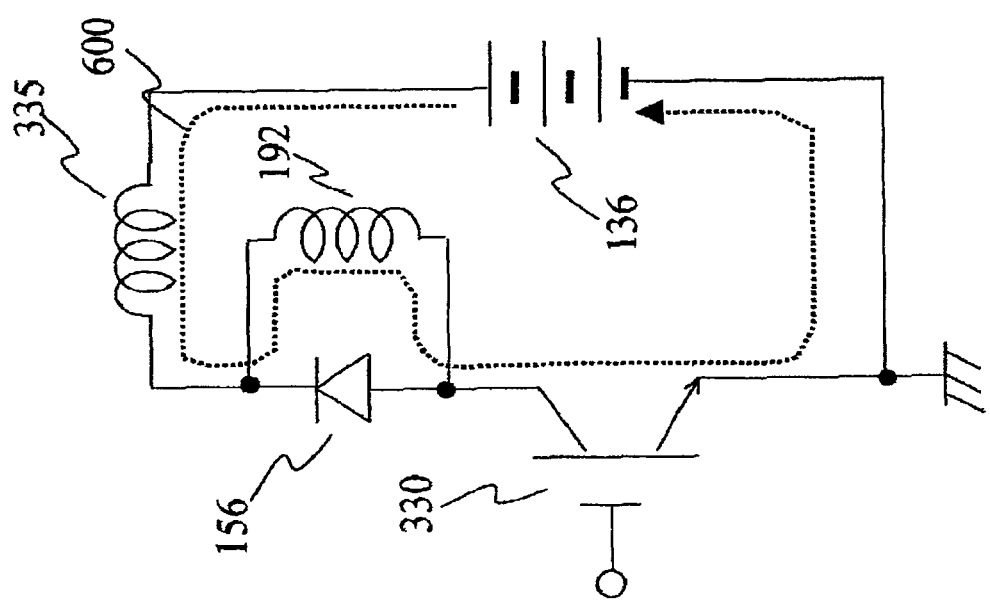

Reduction in the gate voltage 622 to below the threshold level Vth2 results in increase in the voltage 626 (indicated by the dashed-dotted line) applied to the collector voltage of the lower arm IGBT 330, which reaches its peak voltage 628 (FIG. 19). Next, when channel of the IGBT 330 disappears, the collector current stops flowing. The current of the motor generator 192 is maintained by returning through the diode 156 (FIG. 18B).

The collector current shown in FIG. 19 has a variation range Ai, which is the collector current change at turn-off. At is period of time for the reduction in the collector current from 10% to 90%, or time for changeover operation. As mentioned above, when a time change rate of current $\Delta i/\Delta t$ gets larger, the spike voltage ($L \times \Delta i/\Delta t$) is generated by time change of the current in the inductance 335 because the floating inductance 335 (inductance element L) exists on the circuit of the IGBT 330. Direction of a vector is not described herein. High voltage is applied to elements and devices by the spike voltage, leading to voltage breakdown or noise generation. Loss, or heat, is generated based on product of the collector current and the collector voltage of the lower arm IGBT 330.

For reduction in the spike voltage, the time change rate $\Delta i/\Delta t$ should be reduced, that is, change in the gate voltage should be slowed. Although the time change rate of the collector current $\Delta i/\Delta t$ and subsequent spike voltage are reduced, a period for heat generation $\Delta t + T$ and a subsequent heating value are increased. High spike voltage is thus not generated even if the floating inductance 335 (L) and the subsequent time change rate $\Delta i/\Delta t$ are reduced. Therefore, it is preferable that the period for heat generation Δt+T is shortened by reduction in the time change rate Δi/Δt.

Conventionally, a heating value per unit time has been reduced by reduction in the number of operations of the IGBT of the inverter circuit 144 per unit time. In other words, frequency of PWM (pulse-width modulation) to control the gate of the IGBT has been decreased. However, decreasing of the frequency is not preferable in terms of control response and control precision.

In accordance with the present embodiment, inductance of the DC circuit of the inverter circuit is greatly reduced. It is very easy to realize 60 nanohenry or less. It is easy to realize 30 nanohenry or less. Appropriate configuration realizes 20 nanohenry or less. The time change rate Δi/Δt is increased by decreasing the inductance element. Switching frequency (basic frequency of PWM) of the IGBT 330 can be increased. For example, it is possible to increase the switching frequency by 1 kHz or more, preferably by 10 kHz or more. It is possible to make switching operation time (Δt in FIG. 19: the period of time for the collector current to decrease from 90% to 10%) 1 µs or less, preferably 0.5 µs or less, or more preferably 0.2 µs or less. In the power inverter 200 with such characteristics, it is possible to greatly reduce the heating value with the spike voltage properly controlled and with high-performance controllability ensured. Engine coolant may be used for the coolant depending on the heating value.

Reduction in inductance of the power module 300 will be described with reference to FIGS. 20A to 21. As above described, FIG. 21 is the top view of the power module 300. FIGS. 20A to 20C are the schematic diagrams for effects of the reduction in inductance with the upper and lower arms series circuit 150 for one of the three phases as a representative. The description is applicable to the rest of the three phases. FIG. 20A shows configuration of chips of the upper and lower arms series circuit 150 and the flow of the recovery current of the diode. FIG. 20B shows the circuit where the recovery current of the diode flows. FIG. 20C illustrates induced current generated on the metal board 304.

The power module 300 shown in FIG. 21 is provided with the fin 305 on the back side of the metal board 304 as shown in FIG. 14. The thin insulation 334 such as a ceramic substrate is fixed by, for example, soldering on the surface of the metal board 304. The conductors 329, 331, 333, and 337 made of, for example, copper film are fixed on the surface of the thin insulation 334. Chips of the IGBT 328 and the diode 156 are electrically connected to the conductor 329 with a collector surface of the IGBT chip and a cathode surface of the diode chip fixed on the surface of the conductor 329. Chips of the IGBT 330 and the diode 166 are electrically connected to the conductor 333 with collector surface of the IGBT chip and cathode surface of the diode chip fixed on the surface of the conductor 333.

The positive busbar 315, which is provided integrally with the DC positive terminals 314 of the power module 300, and the negative busbar 317, which is provided integrally with the DC negative terminals 316 of the power module 300, are laminated with the insulation member. The laminated busbars extend to the substantial center over the part where the upper arm is placed. The positive busbar 315 is connected to the conductor 329 at the junction 339. The negative busbar 317 is connected to the conductor 337 at the junction 341. In accordance with the present embodiment, the junctions 339 and 341 are disposed adjacent to each other in the substantial center of the conductor 329 for the upper arm and the conductor 337 for the lower arm. With the junctions 339 and 341 positioned closely to each other, the recovery current that flows through the upper and lower arms flow in the closed circle from the junction 339 to the junction 341. The recovery current of the diode of the inverter circuit 144 flowing in the circle induces the eddy current on the metal board 304. Magnetic flux by the induced current and magnetic flux by the recovery current cancel each other out, results in reduction in inductance related to the recovery current.

Connecting terminals that connect the upper arm with the lower arm are denoted by terminals A and B (FIGS. 20A and 20B). The terminals A and B are juxtaposed to each other in the substantial center and right (as an example in accordance with the present embodiment) and connected each other with a wire 336. The terminals A and B correspond to the intermediate electrodes 169 (FIG. 2). As in accordance with the present embodiment, placing the junctions 339 and 341 on one side of right or left, and the junction of the upper arm and lower arms on the other side makes the recovery current flow more in the circle and results in more effective reduction in inductance.

As illustrated, the recovery current 338 of the diode of the inverter circuit 144 flows all the way from the DC positive terminal 314 to the DC negative terminal 316 via the junction 339, either the IGBT 328 or the diode 156 of the upper arm, the terminal A, the wire 336, the terminal B, either the IGBT 330 or the diode 166 of the lower arm, and the junction 341. The current 338 flows in the circle which is made as closed as possible by juxtaposition of the junctions 339 and 341. The conductors between the DC positive terminal 314 and the junction 339 and between the DC negative terminal 316 and the junction 341 are illustrated like sticks (FIG. 20A). In reality, however, they are laminated plate conductors (FIG. 21, etc.). The currents 338 flowing through the laminated positive busbar 315 and the laminated negative busbar 317 are in opposite direction to each other with almost same magnitude, cancel the magnetic flux of each other out, and result in reduction in inductance.

The current flow in the substantial circle induces the eddy current 340 which flows on the metal board 304 as shown in FIG. 20C. The magnetic flux is generated again by the eddy current 340 and cancels out the magnetic flux generated by the current flow in the substantial circle. So, the inductance of the current flow in the substantial circle is reduced. The juxtaposition of the junctions 339 and 341 makes the induced current flow more on the metal board 304 and reduces the inductance more in comparison to the junctions 339 and 341 placed distantly.

The parallel placement of the conductors and the current in opposite directions, in addition to the reduction in the inductance related to the chip placement, reduce the inductance generated between the DC positive and negative terminals 314 and 316 and the junctions 339 and 341, resulting in reduction in the inductance of the entire power module 300 related to the recovery current.

FIG. 20B shows the upper and lower arms series circuit 150 for one of the three phases of the inverter circuit. Since the upper arm IGBT 328 and the lower arm IGBT 330 do not conduct electricity at the same time, short-circuit current does not flow through the upper and lower IGBTs. However, the recovery current flows through the diodes 156 and 166. Since the recovery current flows reversely to polarity of the diodes, the recovery current is generated on the series circuits between the DC positive terminal 314 and the DC negative terminal 316 made up of the diode and either the upper IGBT 328 and the lower IGBT 330 which is in a conduction state. Reduction in the inductance on the entire series circuits between the DC positive terminal 314 and the DC negative terminal 316 contributes to reduction in negative effect of the spike voltage caused by the switching operation of the inverter. The configuration in FIG. 20A enables the inductance to be reduced.

Reduction in the inductance and heat of the semiconductor module in accordance with the present embodiment will be further described. Transient voltage rise or heat generation from the semiconductor chips is generated during switching operation of the upper or lower arm which makes up the inverter circuit. Therefore, a period of time for the switching operation should preferably be shortened in accordance with reduction in inductance at the switching operation and the spike voltage. It should be implemented not only measures for change of the current that flows the switching devices including the IGBTs as spike voltage at the switching operation but also measures for the recovery current of the diodes generated at the transition. Reduction in the inductance will be detailed with an example of the recovery current of the diode of the lower arm.

The recovery current of the diode is a current that flows in spite of the reverse bias to the diode and is caused by carrier filled in the diode in forward direction to the diode. Conduction or interruption of the upper or lower arm, which makes up the inverter circuit, operated in a routine order results in generating three-phase AC electric power in the AC terminals of the inverter circuit. With the switching operation, large inductance of the stator coil causes the return current to flow in the stator coil of the motor generator via the diodes which makes up the inverter for maintaining current value. The return current is a forward current of the diode and the carrier fills inside the diode. Then, when the status of the semiconductor chip 328 in operation as the upper arm is switched from interruption to conduction again, the recovery current arisen from the carrier flows in the diode of the lower arm. In a routine operation, either the upper or lower arm series circuit is interrupted, therefore, the short-circuit current does not flow in the upper and lower arms. However, transient current, for example, the recovery current of the diode flows the series circuit made up of the upper and lower arms. The current that flows through the series circuit may generate high spike voltage.

When the IGBT 328 which operates as the upper arm is switched on, for example, the recovery current of the lower arm diode 166 may flow from the positive terminal 314 to the negative terminal 316 via the IGBT 328 and the lower arm diode 166, with the IGBT 330 hereat interrupted. The conductor between a terminal P and the junction 339 and the conductor between a terminal N and the junction 341 are placed parallel and wherein the same recovery current flows in opposite directions (FIG. 20A). As a result, the inductance of current pathway is reduced because the generated magnetic fields cancel each other out in a space between the conductors. The inductance is reduced because of the laminated structure where the conductors between the terminals are closely and opposingly placed (inductance-reduction effect by laminate effect).

The pathway for parallel current with opposite directions is followed by circle-shaped pathway in the recovery current pathway. Current flowing through the circle-shaped pathway causes the eddy current 340 to flow on the metal board 304. Effect of the eddy current for canceling the magnetic fields out causes the inductance to be reduced in the circle-shaped pathway.

Above description includes merely the recovery current of the diode 166. The recovery current of the diode 156, however, may be generated by the conduction of the lower arm IGBT 330. Also in this case, the inductance is reduced likewise (FIG. 20B). In the case of using a metal-oxide-semiconductor transistor (MOS transistor) in place of the IGBT, although any diode is not apparently used, in fact the diode 156 or 166 exists in the MOS transistor, therefore the same phenomena as that mentioned above is seen. The above-mentioned operations and advantageous effects can be achieved with configurations shown in FIG. 20 or the other Figs. in the case of using the MOS transistor.

With configuration of the circuit of the semiconductor module in accordance with the present embodiment, effects of the laminated structure and the eddy current reduce the inductance. Reduction in inductance at the switching operation is significant. The semiconductor module in accordance with the present embodiment contains the series circuits of the upper and lower arms inside the semiconductor module itself. The inductance-reduction effect in the transient status is thus remarkable, for example, the reduction in the inductance to the recovery current of the diode flowing through the upper and lower arms series circuit. Reduction in inductance realizes low induced current generated by the semiconductor module, low-loss circuit configuration, and improved switching speed which results in reduced period of heat generation.

The connections between the DC positive terminal 314 and the DC negative terminal 316 of the power module 300 are bent in the opposite direction to each other (FIGS. 6, 13, 15, and 21). The internal surfaces of the laminated structure are exposed to make up the connecting surfaces with other DC lines. This configuration is highly effective in the inductance-reduction of the connections, and is detailed hereinafter.

The capacitor module 500 in accordance with the present embodiment includes advantageous effects in the inductance-reduction, raised productivity, and great cooling effect.

Figure 22:
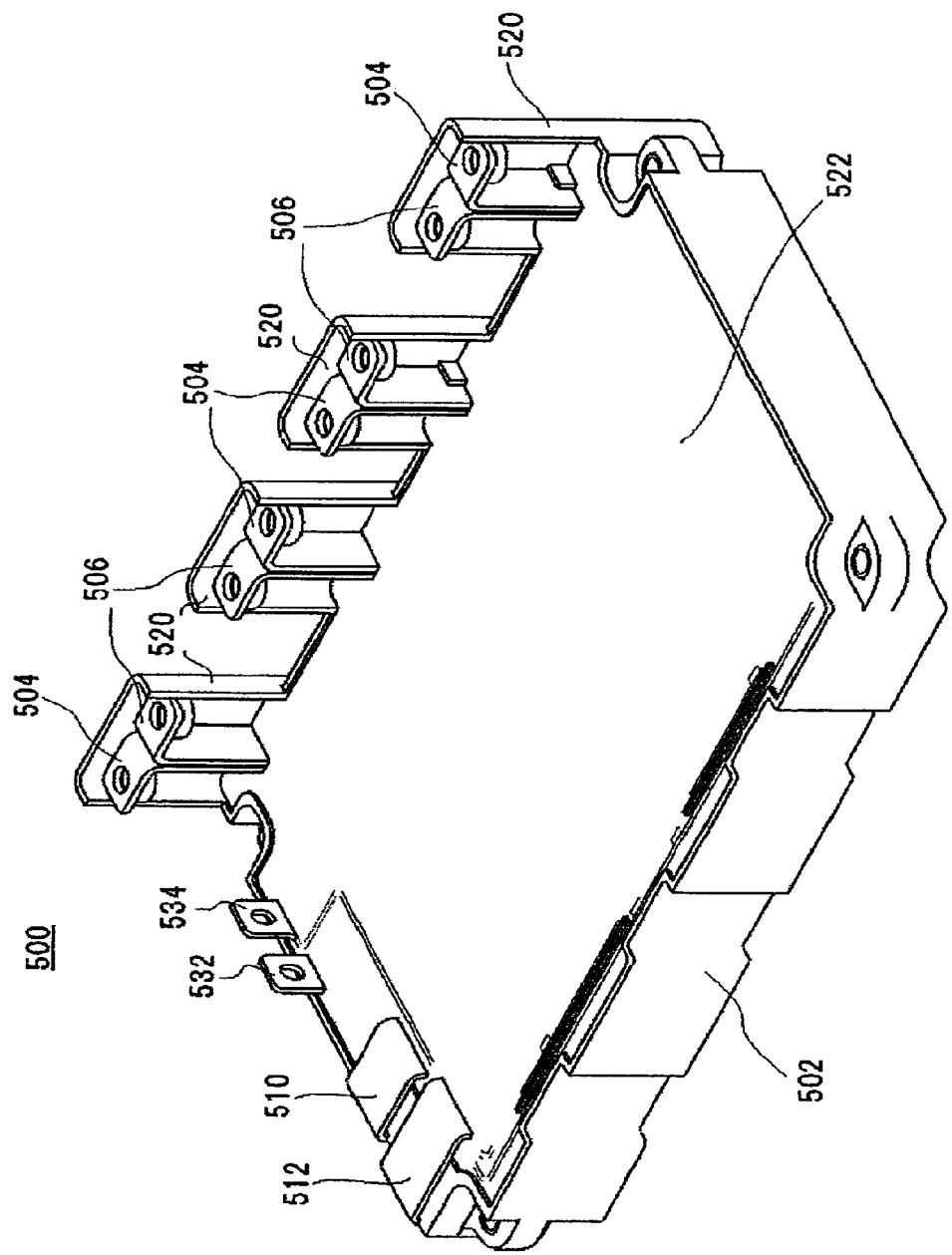
FIG. 22 is a perspective view that shows an external configuration with a filling material on a capacitor module which relates to the present embodiment.
Figure 23:
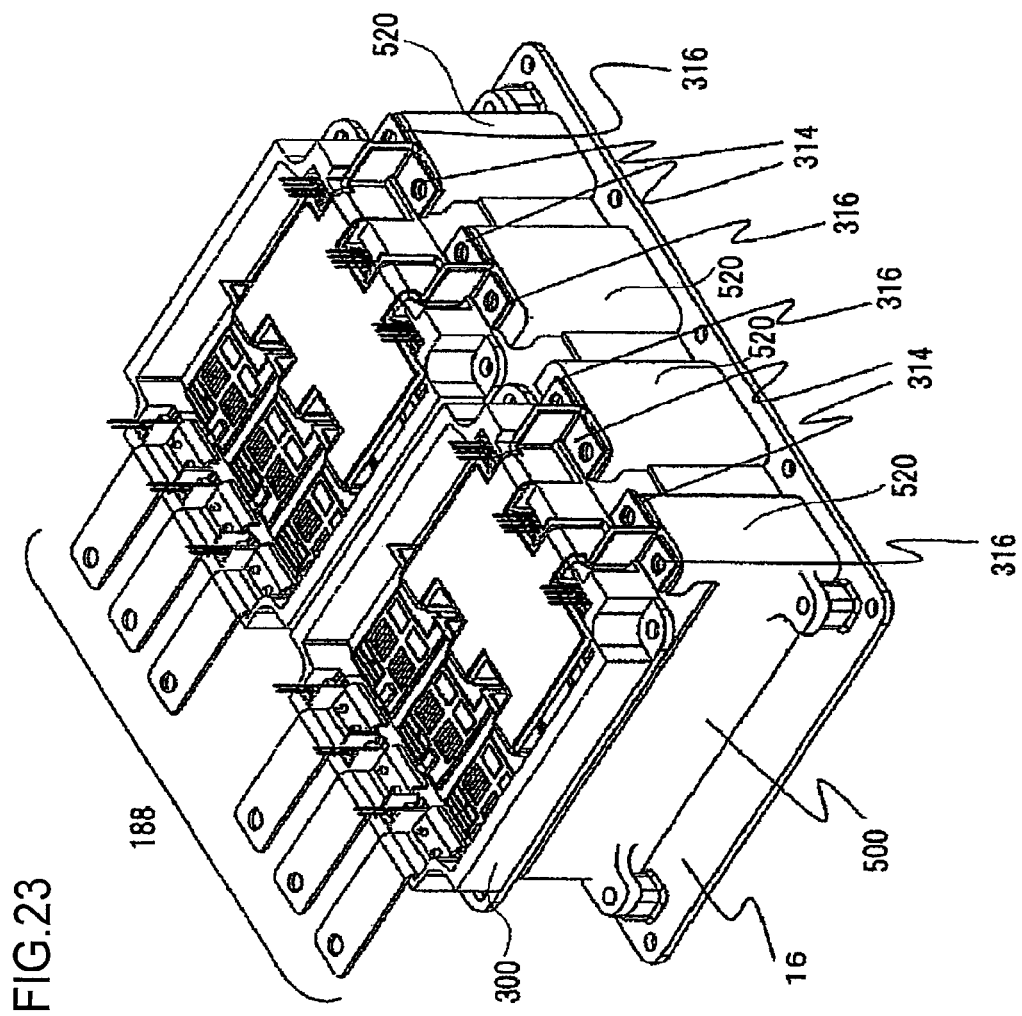
FIG. 23 is a top perspective view of a connecting structure of the power module and the capacitor module which relate to the present embodiment.
Figure 24:
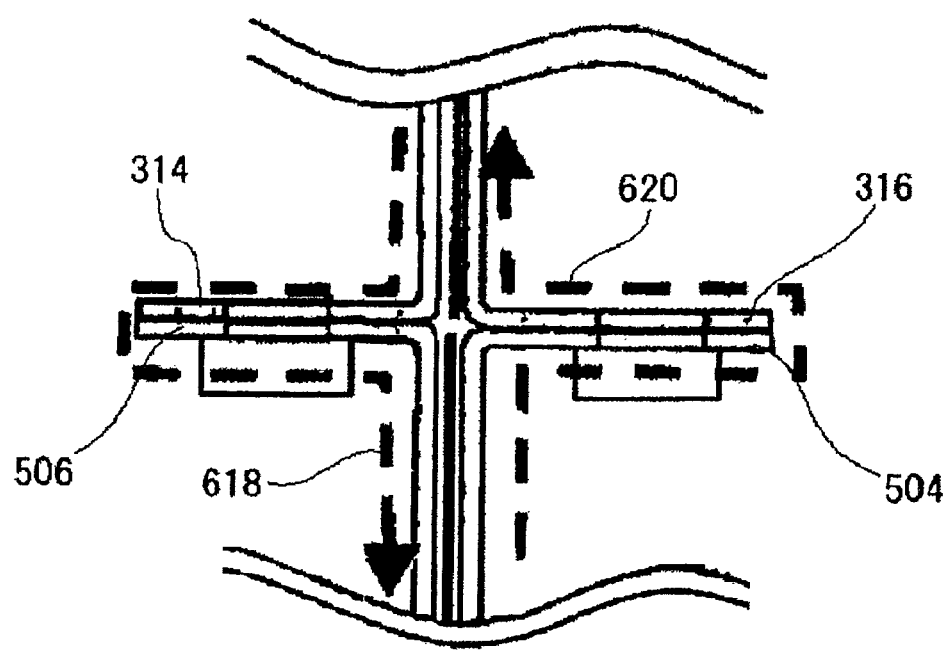
FIG. 24 is a view that shows flow of electric current at a connection between a DC terminal and a capacitor terminal of the power module which relates to the present embodiment.
Figure 25:
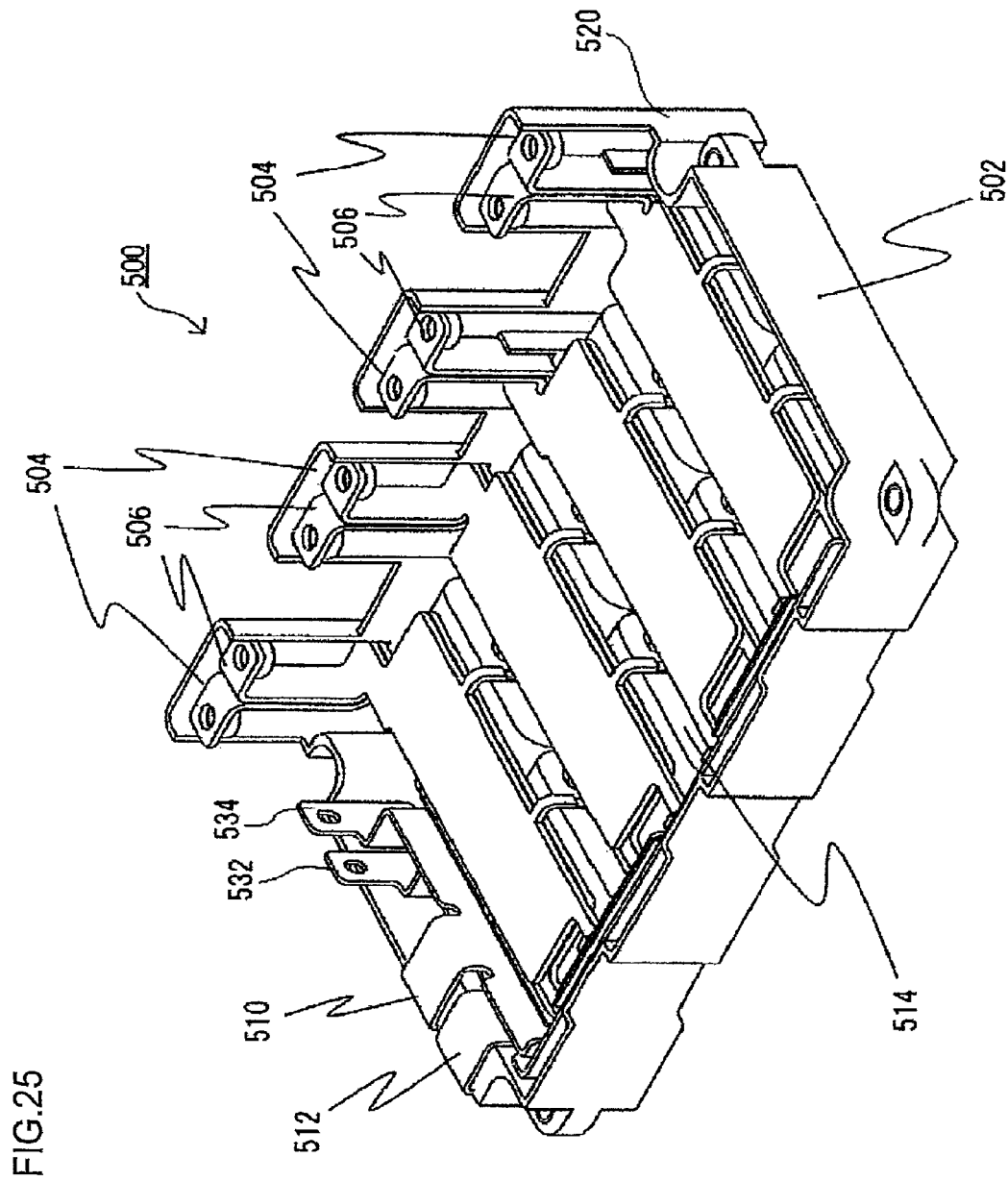
FIG. 25 is a top perspective view that shows an external configuration of the capacitor module which relates to the present embodiment without the filling material.
Figure 26:
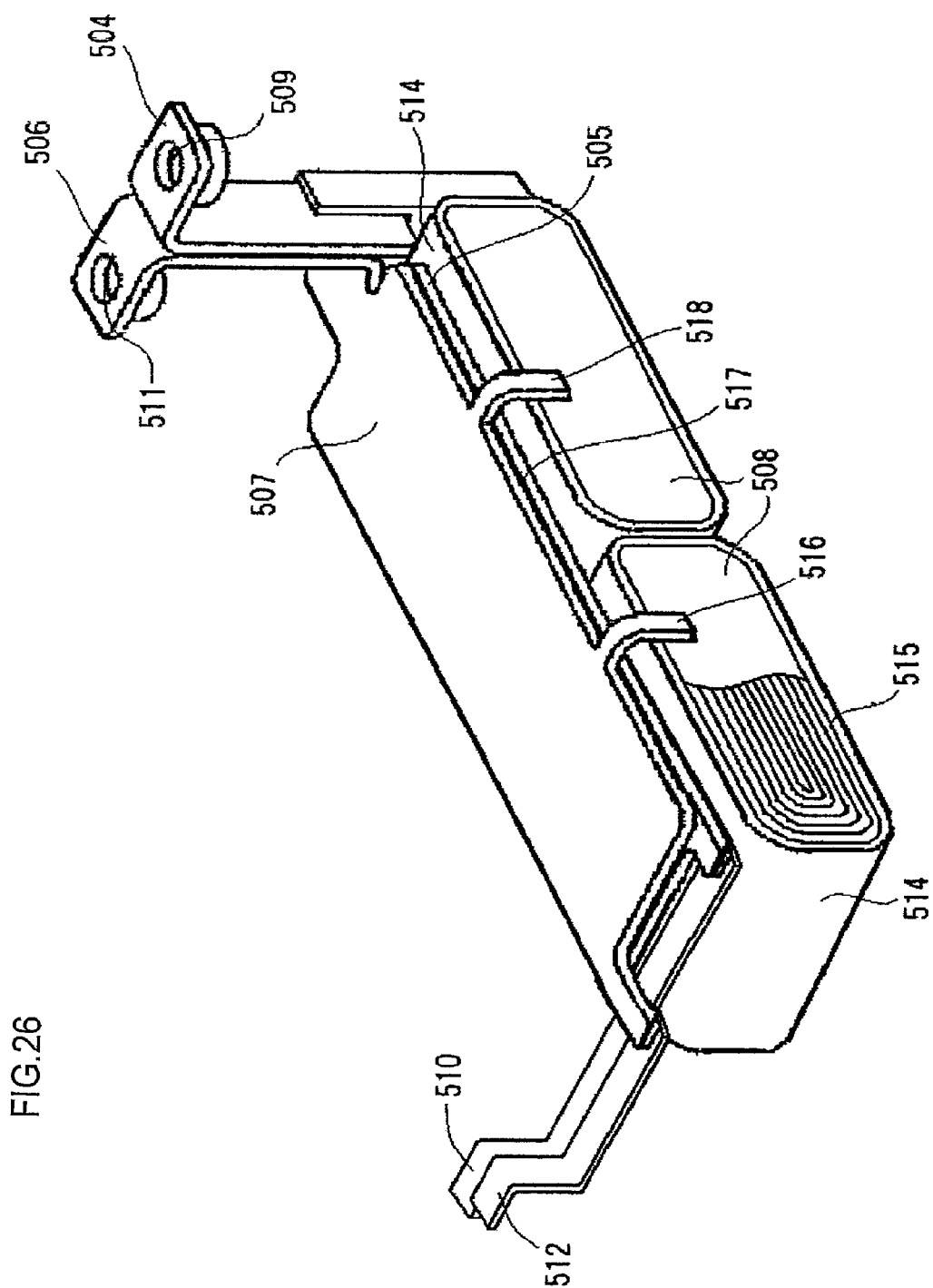
FIG. 26 is a view that shows a pair of a negative terminal and a positive terminal of the capacitor module that make up a basic unit of the capacitor module which relates to the present embodiment.

The capacitor module 500 will be hereinafter detailed with reference to FIGS. 22 to 26. FIG. 22 is a perspective view of the external configuration of the capacitor module 500 which relates to the present embodiment. FIG. 23 is a top perspective view that illustrates the connection between the capacitor module 500 and the power modules 300. FIG. 24 is a view that shows the connection which reduces the inductance. FIG. 25 is a perspective view that shows the capacitor module 500 before a filling material 522 such as resin is filled. FIG. 26 is a detailed structure of the capacitor module 500 showing the configuration of the capacitor cells 514 fixed to the laminated busbar.

In FIGS. 22 to 26, components are numbered as follows: capacitor module 500; capacitor case 502; negative terminals 504; positive terminals 506; DC (battery) negative connecting terminal 510; DC (battery) positive connecting terminal 512; positive terminal for auxiliaries 532; negative terminal for auxiliaries 534; and, capacitor cells 514, respectively.

A plurality of sets, four sets in accordance with the present embodiment, of the laminated busbar made up of the negative busbar 505 and the positive busbar 507 are electrically connected in parallel to the DC (battery) negative connecting terminal 510 and the DC (battery) positive connecting terminal 512. The negative busbar 505 and the positive busbar 507 are provided with a plurality of the terminals 516 and 518 for each positive terminal and each negative terminal of a plurality of the capacitor cells 514 to be connected in parallel (FIGS. 25 and 26).

Each of the capacitor cells 514, which is an unit structure of storage section of the capacitor module 500, is provided with the film capacitor 515 which includes two kinds of conductive films—films for the positive and negative terminals—sandwiching an insulating film and wound. The film capacitor 515 with winding structure is provided with a positive terminal conductive material 508 which is electrically connected to the positive film on one end and a negative terminal conductive material 508 which is electrically connected to the negative film on the other end. The negative terminal conductive material 508 is hidden in the given Figs. The positive and negative terminals conductive materials 508 are soldered or deposited to each of the wound films respectively.

Both the negative busbar 505 and the positive busbar 507 have the laminated structure. Planar shape of the lamination layer made up of the negative busbar 505 and the positive busbar 507 is long and thin substantially rectangular parallelepiped. Width of the plane (length of a short side of the plane) is substantially similar to length of the capacitor cell 514 in the winding axis direction. The terminals 516 and 518 are respectively provided at both ends of the short sides of the lamination layer made up of the negative busbar 505 and the positive busbar 507. The terminals 516 and 518 of the negative side are hidden in FIG. 26. The terminals 516 and 518, which are provided at the both ends of the lamination layer made up of the negative busbar 505 and the positive busbar 507, are respectively soldered or welded to the conductive materials 508 at both ends of the two capacitor cells 514 placed parallel to each other.

As described above, one lateral surface of the wound film capacitor 515 is a positive electrode (surface of the capacitor on which the terminals 516 and 518 are fixed is a positive electrode), while the opposite lateral surface is a negative electrode. The film capacitor 515 is placed on the planar surface of the laminated busbar from both of the negative busbar 505 and the positive busbar 507. An example of the two film capacitors 515 placed along the long side of the laminated busbar is given in accordance with the present embodiment.

Four cell groups are arranged in parallel, with each cell groups composed of the two capacitor cells 514. A total of eight capacitor cells 514 are provided as shown in FIG. 25. One lateral surface of each of the two cells is a positive electrode. This positive electrode is connected to the positive busbar 507 which leads to the positive terminal 506 via either the terminal 516 or 518. The other lateral surface of the capacitor cell 514 is a negative electrode. This negative electrode is connected to the negative busbar 505, which is coupled with the positive busbar 507 across the insulation sheet 517, and led to the negative terminal 504. As shown in FIG. 26, the positive busbar 507 is connected to the DC (battery) positive connecting terminal 512, while the negative busbar 505 is connected to the DC (battery) negative connecting terminal 510, leading to the battery eventually.

The positive terminals of the capacitor cells 514 are linked to the positive terminal 506 via the terminals 516 and 518 and the positive busbar 507 (FIG. 26). The negative terminals of the capacitor cells 514 are linked to the negative terminal 504 via the terminals (back side in FIG. 26) and the negative busbar 505. FIG. 26 shows for one pair of the capacitor terminals 504 and 506, the two capacitor cells 514 are connected in parallel. Even though four pairs of the capacitor terminals 504 and 506 are provided in the example of the Figs., any number of the capacitor cells and any number of the cell groups may be provided depending on capacity. The terminals 504 and 506 are provided with openings 509 and 511, respectively, to be directly screwed to the DC positive and negative terminals 314 and 316 of the power module 300 respectively.

A process for producing the capacitor module 500 will be described as follows. The film capacitor 515 is produced by winding the films for the positive and negative terminals around the insulation sheet. The capacitor cell 514 is produced by fixing the conductive material 508 electrically connected to the positive and negative terminals at the both ends of the film capacitor 515.

The plane laminated busbar provided with the terminals 516 and 518 is produced. The laminated busbar is integrally provided with the positive terminal 506 and the negative terminal 504 extending upright. The laminated busbar is provided with the substantially rectangular plane whose width is substantially equal to the length in the winding axis direction of the film capacitor 515 and whose length in the longitudinal direction is substantially equal to the length of the film capacitor 515 placed in parallel. The plane is provided with a plurality of the capacitor cells 514 arranged in parallel so that the outer circumference surfaces of the capacitor cells 514 face each other. The groups of the cells shown in FIG. 26 are produced by connecting the both ends of each of the cells to the terminals 516 or 158. The groups of the cells are machinable integrally with the positive terminal 506 and the positive busbar 507, and likewise, machinable integrally with the negative terminal 504 and the negative busbar 505. It is possible to mechanically make these busbars laminated with the thin insulation sheet sandwiched between the busbars. A plurality of the capacitor cells 514 are easily connected to the terminals 516 or 518 by use of machine because the terminals 516 or 518 are not surrounded by anything that hinders the production.

The capacitor case 502 having the terminal cover 520 is made of, for example, metal material with high heat conduction. The plurality of the groups of the capacitor cells are inserted into the capacitor case 502. Each of the capacitor cells 514 is arranged on the inside bottom of the metal capacitor case 502 with the outer circumference surfaces of the capacitor cell 514 facing each other. The capacitor module 500 shown in FIG. 22 is produced by inserting predetermined groups of the capacitor cells as shown in FIG. 25 and filling with the filling material 522 made of insulating resin. The capacitor cells are produced by groups. The group of the capacitor cells are inserted into the capacitor case 502 as required. The number of the groups of the capacitor cells to be used is changed depending on a model of a vehicle. The group of the capacitor cells are thus commonly usable.

Regardless of the difference in specifications of the capacitor module 500 according to the model, the group of the capacitor cells can be commonly used. As mentioned above, the group of the capacitor cells are high in productivity.

The outer circumference of the capacitor cell 514 is arranged very closely to the inner surface of the capacitor case 502. The heat generated by the capacitor cells 514 can be transferred through the capacitor case 502. The capacitor module 500 in accordance with the present embodiment has good heat transfer characteristics. As shown in FIG. 8, the heat is transferred from the capacitor case 502, which is held by the lower cover 16, to the coolant passage 19 via the lower cover 16 and the chassis 12.

The capacitor module 500 is provided with not only the positive terminal 506 and the negative terminal 504 but also the positive terminal for auxiliaries 532 and the negative terminal for auxiliaries 534. Each of these terminals are electrically connected with the DC (battery) positive connecting terminal 512 and the DC (battery) negative connecting terminal 510. The terminals for auxiliaries enable the capacitor module 500 to be used for auxiliaries at the same time. AC can be output not only for vehicle driving but also for other auxiliaries. Thus, overall function of the power inverter is improved.

The capacitor case 502 is provided with the terminal cover 502 which protects the negative terminals 504 and the positive terminals 506 in manufacturing process or in transit of the capacitor module 500, resulting in improvement in reliability and productivity.

The connection between the power modules and the capacitor module in the power inverter in accordance with the present embodiment will be hereinafter described with reference to FIG. 23. FIG. 23 is a top perspective view illustrating the connection between the power modules and the capacitor module which relate to the present embodiment.

The capacitor case 502 fixed on the lower cover 16 contains a number of the capacitor cells 514. The negative and positive capacitor terminals 504 and 506 are arranged along the one side of the capacitor case 502. The aforementioned side of the capacitor case 502 is erected in accordance with the capacitor terminals 504 and 506 placed in the upright position above the top of the capacitor cells 514.

Figure 15:
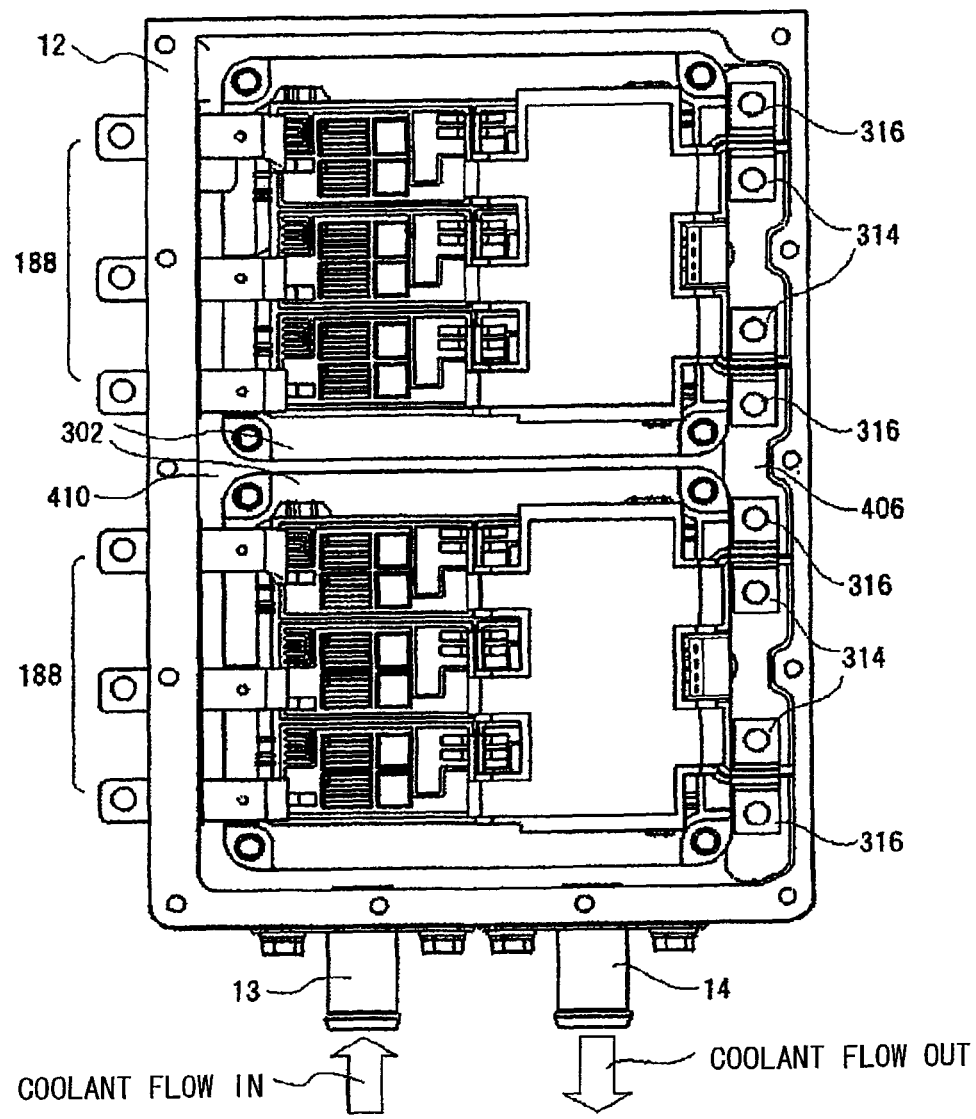
FIG. 15 is a plain view of the chassis in which the power module which relates to the present embodiment is mounted.

The DC negative and positive terminals 314 and 316 of the power module 300 shown in FIGS. 13 and 15 are arranged to face the capacitor terminals 504 and 506. Mounting the power modules 300 on the capacitor 500 enables the ends of the DC negative and positive terminals 314 and 316 to be placed to directly face the capacitor terminals 504 and 506 without any other connecting members.

As shown in FIGS. 13 and 15, the DC positive terminals 314 and the DC negative terminals 316 of the power module 300 protrude from the power module case 502. As illustrated in FIG. 22, the positive terminals 506 and the negative terminals 504 stand upright in a L-shape beyond the surface of the filling material 522 for the capacitor cells from the lateral side. At assembly of the power inverter, the capacitor terminals 504 and 506 with the L-structure come into direct contact with the DC terminals 314 and 316 of the power modules 300, which protrude from the power module case 302. The capacitor terminals 504 and 506 and the DC terminal 314 and 316 are bolted together.

While large inductance may be generated at connection between the terminals, the terminal configuration of the power module 300 and the capacitor module 500 in accordance with the present invention enables inductance to be reduced. Reduction in inductance will be described with reference to FIG. 24.

FIG. 24 shows the flow of electric current at the connection between the negative terminal 504 or the positive capacitor 506 and the DC negative terminal 316 or the DC positive terminal 314 of the power module 300. The negative terminal 504 and the positive terminal 506, and the DC negative terminal 316 and the DC positive terminal 314 are each made up of laminated conductor parts which sandwich the thin insulation member and coupling parts for connecting with the corresponding terminals. The ends of the conductor parts are bent in opposite directions to each other. The internal surface of the laminated structure is exposed to make up the connecting surface for connecting with the corresponding terminal.

The connecting surface extends to right and left around the laminated structure as a center (FIG. 24). The exposed connecting surfaces are contacted with each other. The electric current flows through the positive and negative busbars via the contacting surface. The flow of the current on the positive terminal 618 and the flow of the current on the negative terminal 620 are illustrated in FIG. 24. Even though distribution of the current on the contacting surface may vary depending on conditions of the contacting surface, the current which flows from the central laminated part and through right and left on the contacting surface, returns to the central laminated part. The magnitude and the direction of the electrical current flowing right and left and the electrical current returning to the central laminated part after passing through the contacting surface are equal and opposite respectively. Therefore, the magnetic fluxes generated by each current cancel each other out. Thus, the inductance of the connection is greatly reduced.

It is not preferable for the inductance of the connection to be large while the inductance of busbar is small. According to the present embodiment, the configuration shown in FIG. 24 reduces the inductance of the connection. It is most preferable that in accordance with the present embodiment the DC terminal of the power module 300 is directly connected with the DC terminal of the capacitor module 500. The inductance of the connection, however, is reduced not only by direct connection but also by using other laminated connection conductor.

In accordance with the present embodiment, the direct connection between the terminals of the capacitor 500 and the power module 300 enables the number of the components to be decreased, assembly workability to be improved, and miniaturization to be realized. In accordance with the present embodiment, furthermore, removing the floating inductance by the intermediate member which connects between the terminals of conventional capacitor module and power module achieves reduction in the spike voltage and improvement in reliability of the power inverter.

As the above description with reference to the FIG. 24, in accordance with the present embodiment, the connection splits into opposite directions to each other. And, the current flow turns near the connecting surface with the other conductor. Therefore, the magnetic fluxes by each current cancel each other out near the connecting surface. Thus, the inductance of the connection is greatly reduced. The terminal connection having this structure reduces the inductance of the connection. Therefore, it is most preferable that the DC terminals of the power module 300 and of the capacitor module 500 are directly connected with each other. The inductance of the overall circuit, however, can be reduced even if other laminated busbar is used between both terminals.

As described above, in accordance with embodiments of the present invention, the inductance of the smoothing capacitor and the inverter circuit will be reduced. At the same time, the volume of the power inverter will be reduced. And, the maximum conversion electric power value per unit volume of the power inverter will be increased.

The above-described embodiments are examples, and various modifications can be made without departing from the scope of the invention.

What is claimed is:

1. A power inverter comprising:
   a power module that converts a direct current to an alternating current; and
   a capacitor module that smooths the direct current;
   wherein:
   the power module comprises:
   a plurality of first power semiconductor devices that constitutes U-phase, V-phase and W-phase upper arms of an inverter circuit;
   a plurality of second power semiconductor devices that constitutes U-phase, V-phase and W-phase lower arms of the inverter circuit;
   an insulation substrate on which the plurality of first power semiconductor devices are mounted;
   a power module case that encloses the plurality of first power semiconductor devices and the plurality of second power semiconductor devices and is formed in a rectangular shape including at least a first side and a second side which is disposed opposite to the first side;

a first direct current positive terminal and a first direct current negative terminal that protrude from the first side of the power module case;

a second direct current positive terminal and a second direct current negative terminal that protrude from the first side of the power module case;

an alternating current power line that protrudes from the second side of the power module case;

a positive conductor that transmits electric current flowing between the first and second direct current positive terminals and the plurality of first power semiconductor devices; and a negative conductor that transmits electric current flowing between the first and second direct current negative terminals and the plurality of second power semiconductor devices;

the capacitor module includes a capacitor positive terminal connected to the first and second direct current positive terminals and a capacitor negative terminal connected to the first and second direct current negative terminals;

each of the positive conductor and the negative conductor includes:

an extended portion that passes through an area facing the insulation substrate with the plurality of the first power semiconductor devices therebetween;

a U-phase junction that is extended to a vicinity of a space between the U-phase first power semiconductor device and the U-phase second semiconductor device;

a V-phase junction that is extended to a vicinity of a space between the V-phase first power semiconductor device and the V-phase second semiconductor device;

a W-phase junction that is extended to a vicinity of a space between the W-phase first semiconductor device and the W-phase second semiconductor device; and the extended portion of the positive conductor and the extended portion of the negative conductor are laminated by sandwiching an insulation member in a middle of the area.

2. A power inverter according to claim 1, wherein:
the positive conductor is formed integrally with the first and second direct current positive terminals; and
the negative conductor is formed integrally with the first and second direct current negative terminals.

3. A power inverter according to claim 1, further comprising:
a chassis that forms a coolant passage, wherein:
the power module is disposed in the chassis on one side of the coolant passage so as to face the collant passage;
the capacitor module is disposed on another side of the coolant passage so as to place the coolant passage between the power module and the capacitor module;
a through hole is formed at a side portion of the coolant passage; and
the capacitor positive terminal extends from the other side on which the capacitor module is disposed to the one side on which the power module is disposed through the through hole.

4. A power inverter according to claim 3, wherein:
the capacitor module includes a terminal cover that covers the capacitor positive terminal and the capacitor negative terminal; and
the terminal cover extends from the other side on which the capacitor module is disposed to the one side on which the power module is disposed through the through hole.

5. A power inverter according to claim 3, wherein:
the power module includes a metal base on which the insulation substrate is mounted;
an opening that is open to the coolant passage is formed in the chassis; and
the metal base covers the opening.

* * * * *